United States Patent
Naganuma et al.

(10) Patent No.: US 8,908,377 B2
(45) Date of Patent: Dec. 9, 2014

(54) WIRING BOARD AND METHOD FOR MANUFACTURING THE SAME

(75) Inventors: Nobuyuki Naganuma, Ogaki (JP); Michimasa Takahashi, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 255 days.

(21) Appl. No.: 13/483,830

(22) Filed: May 30, 2012

(65) Prior Publication Data
US 2013/0025925 A1 Jan. 31, 2013

Related U.S. Application Data

(60) Provisional application No. 61/511,332, filed on Jul. 25, 2011.

(51) Int. Cl.
| | | |
|---|---|---|
| H05K 1/14 | (2006.01) | |
| H05K 1/18 | (2006.01) | |
| H05K 1/11 | (2006.01) | |
| H05K 3/46 | (2006.01) | |
| H05K 3/42 | (2006.01) | |

(52) U.S. Cl.
CPC ............ *H05K 3/4694* (2013.01); *H05K 3/4697* (2013.01); *H05K 3/42* (2013.01); *H05K 2201/09145* (2013.01); *H05K 2201/048* (2013.01); *H05K 2201/2072* (2013.01)
USPC ............ 361/736; 361/761; 361/809; 174/262

(58) Field of Classification Search
CPC ....... H05K 1/112; H05K 1/115; H05K 1/182; H05K 1/183; H05K 1/142; H05K 1/144; H05K 3/429; H05K 3/4602; H05K 3/4069; H05K 3/4046; H05K 2201/096; H05K 2201/09845; H05K 7/023
USPC .......... 174/261, 262, 264–266; 361/760, 761, 361/729, 735, 736, 807, 809, 790, 792
See application file for complete search history.

(56) References Cited

U.S. PATENT DOCUMENTS

| | | | | |
|---|---|---|---|---|
| 6,998,533 B2 * | 2/2006 | De Samber et al. | .......... | 174/521 |
| 2005/0061544 A1 * | 3/2005 | Nakakuki | ..................... | 174/261 |

(Continued)

FOREIGN PATENT DOCUMENTS

| | | |
|---|---|---|
| JP | 2004-031985 A | 1/2004 |
| TW | 200847363 | 12/2008 |
| WO | WO 2011/010498 A1 | 1/2011 |
| WO | WO 2011/052399 A1 | 5/2011 |

OTHER PUBLICATIONS

U.S. Appl. No. 13/538,095, filed Jun. 29, 2012, Naganuma, et al.

*Primary Examiner* — Hoa C Nguyen
(74) *Attorney, Agent, or Firm* — Oblon, Spivak, McClelland, Maier & Neustadt, L.L.P.

(57) ABSTRACT

A wiring board has a first rigid wiring board having an accommodation portion, a second rigid wiring board accommodated in the accommodation portion, an insulation layer formed over the first rigid wiring board and the second rigid wiring board, and a joint conductor extending in a direction from a first surface of the first rigid wiring board to a second surface of the first rigid wiring board on the opposite side of the first surface of the first rigid wiring board such that the joint conductor is penetrating through the boundary between the first rigid wiring board and the second rigid wiring board and joining the first rigid wiring board and the second rigid wiring board.

23 Claims, 31 Drawing Sheets

(56) References Cited

U.S. PATENT DOCUMENTS

| | | | |
|---|---|---|---|
| 2007/0281394 A1* | 12/2007 | Kawabe et al. | 438/118 |
| 2008/0169120 A1* | 7/2008 | Inagaki et al. | 174/255 |
| 2010/0025081 A1* | 2/2010 | Arai et al. | 174/251 |
| 2010/0081236 A1* | 4/2010 | Yang et al. | 438/119 |
| 2011/0019383 A1 | 1/2011 | Aoyama et al. | |
| 2012/0043127 A1* | 2/2012 | Lin et al. | 174/266 |
| 2012/0300425 A1* | 11/2012 | Nakashima et al. | 361/761 |
| 2013/0003314 A1* | 1/2013 | Igarashi et al. | 361/719 |

* cited by examiner

US 8,908,377 B2

WIRING BOARD AND METHOD FOR MANUFACTURING THE SAME

CROSS-REFERENCE TO RELATED APPLICATIONS

The present application is based on and claims the benefit of priority to U.S. Application No. 61/511,332, filed Jul. 25, 2011, the entire contents of which are incorporated herein by reference.

BACKGROUND OF THE INVENTION

1. Field of the Invention

The present invention relates to a wiring board and its manufacturing method.

2. Discussion of the Background

In Taiwanese Patent Publication No. 200847363, a wiring board is described where a second wiring board is accommodated in a penetrating hole formed in a first wiring board, and wiring in the first wiring board is electrically connected to wiring in the second wiring board. The entire contents of Taiwanese Patent Publication No. 200847363 are incorporated in this application.

SUMMARY OF THE INVENTION

According to one aspect of the present invention, a wiring board has a first rigid wiring board having an accommodation portion, a second rigid wiring board accommodated in the accommodation portion, an insulation layer formed over the first rigid wiring board and the second rigid wiring board, and a joint conductor extending in a direction from a first surface of the first rigid wiring board to a second surface of the first rigid wiring board on the opposite side of the first surface of the first rigid wiring board such that the joint conductor is penetrating through the boundary between the first rigid wiring board and the second rigid wiring board and joining the first rigid wiring board and the second rigid wiring board.

According to another aspect of the present invention, a method for manufacturing a wiring board includes preparing a first rigid wiring board having an accommodation portion, accommodating a second rigid wiring board in the accommodation portion of the first rigid wiring board, forming an insulation layer over the first rigid wiring board and the second rigid wiring board, forming a hole extending in a direction from a first surface of the first rigid wiring board to a second surface of the first rigid wiring board on the opposite side of the first surface of the first rigid wiring board such that the hole is penetrating through the boundary between the first rigid wiring board and the second rigid wiring board, and forming a joint conductor in the hole such that the joint conductor joins the first rigid wiring board and the second rigid wiring board.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
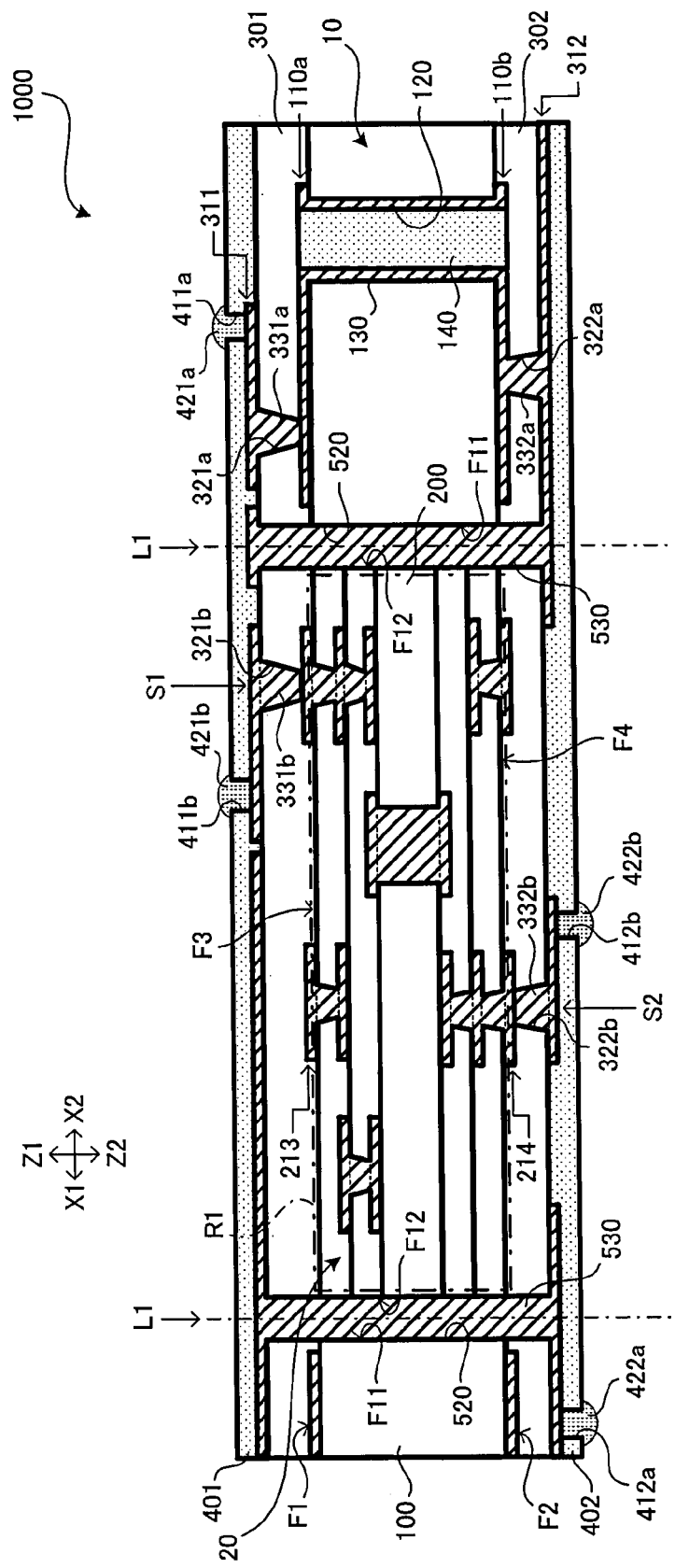
FIG. 1 is a cross-sectional view of a wiring board according to an embodiment of the present invention.

The embodiments will now be described with reference to the accompanying drawings, wherein like reference numerals designate corresponding or identical elements throughout the various drawings.

In the drawings, arrows (Z1, Z2) each indicate a lamination direction in a wiring board (or a thickness direction of the wiring board) corresponding to a direction along a normal line to the main surfaces (upper and lower surfaces) of the wiring board. On the other hand, arrows (X1, X2) and (Y1, Y2) each indicate a direction perpendicular to a lamination direction (or a direction to a side of each layer). The main surfaces of the wiring board are on the X-Y plane. Side surfaces of the wiring board are on the X-Z plane or the Y-Z plane. "Directly on" or "directly under" means direction Z (Z1 side or Z2 side).

In the present embodiment, a side closer to the core (substrates 100, 200) is referred to as a lower layer, and a side farther from the core as an upper layer in a lamination direction.

A conductive layer is formed with one or multiple conductive patterns. A conductive layer may include a conductive pattern that forms an electrical circuit such as wiring (including ground), a pad, a land or the like, for example, or it may include a planar conductive pattern that does not form an electrical circuit.

Opening portions include notches, cuts or the like in addition to holes and grooves. Holes are not limited to penetrating holes, and non-penetrating holes are also referred to as holes.

Among the conductors formed in opening portions, conductive film formed on the inner surface of an opening portion (wall or bottom surface) is referred to as a conformal conductor, and conductor filled in an opening portion as a filled conductor. Also, conductor formed in a via hole (wall or bottom surface) is referred to as a via conductor, and conductor formed in a through hole (wall surface) as a through-hole conductor. A stacked-conductor structure means an assembly formed by stacking filled conductors in two or more layers.

Plating includes wet plating such as electrolytic plating as well as dry plating such as PVD (physical vapor deposition) and CVD (chemical vapor deposition).

"Accommodated in an accommodation section" includes situations in which the entire second rigid wiring board is positioned completely in an accommodation section, as well as situations in which only part of a second rigid wiring board is positioned in an accommodation section. In short, it is sufficient if at least part of a second rigid wiring board is positioned in an accommodation section.

As shown in FIG. 1, wiring board 1000 of the present embodiment has wiring board 10 (first rigid wiring board), wiring board 20 (second rigid wiring board), insulation layers (301, 302), conductive layers (311, 312), via conductors (331a, 331b, 332a, 332b), through-hole conductor 530 (joint conductor), solder resists (401, 402), and external connection terminals (421a, 421b, 422a, 422b). In the following, one (Z1 side) of upper and lower surfaces (two main surfaces) of wiring board 10 is referred to as first surface (F1), and the other (Z2 side) as second surface (F2). Also, one (Z1 side) of upper and lower surfaces (two main surfaces) of wiring board 20 is referred to as third surface (F3), and the other (Z2 side) as fourth surface (F4).

Wiring board 10 has accommodation section (R1), and wiring board 20 is accommodated in accommodation section (R1) formed in wiring board 10. Conductor in wiring board 10 and conductor in wiring board 20 are electrically connected to each other. In addition, insulation layers (301, 302) are formed respectively on wiring board 10 and on wiring board 20. Accommodation section (R1) of the present embodiment is a penetrating hole. Wiring board 1000, wiring board 10 and wiring board 20 are each a rigid printed wiring board.

Figure 2:
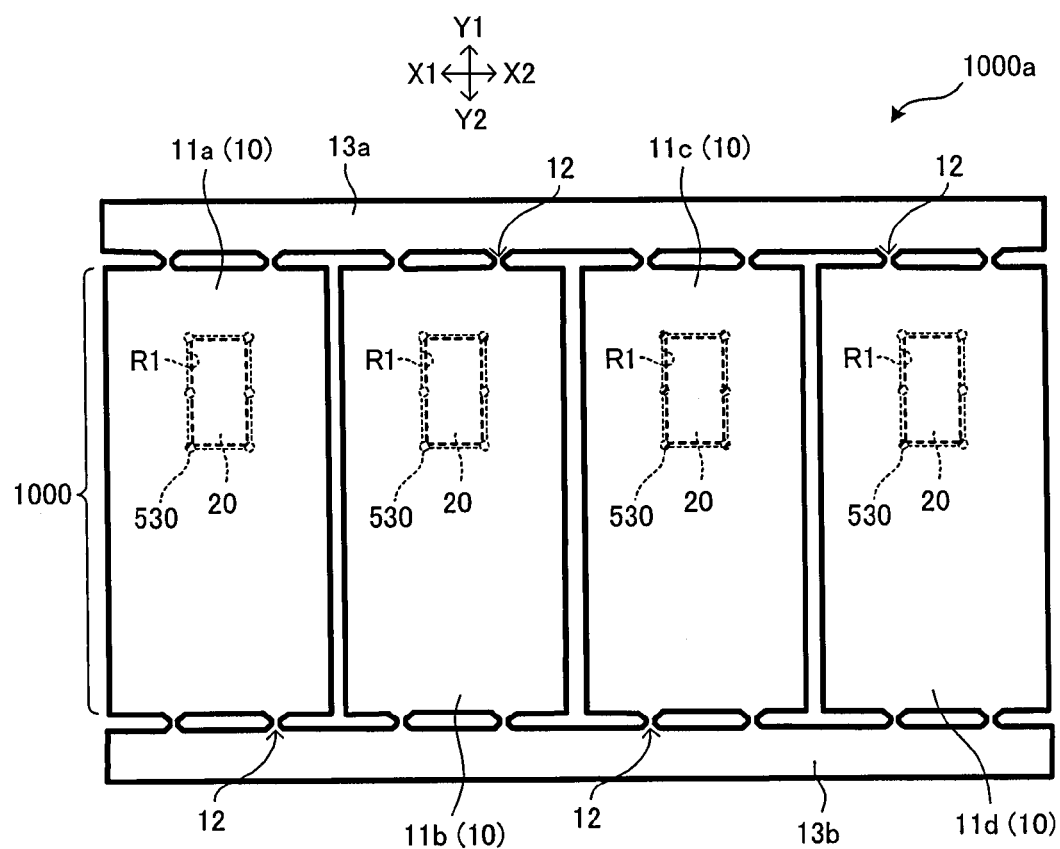
FIG. 2 is a plan view of the wiring board shown in FIG. 1.

In the present embodiment, multiple wiring boards 1000 form frame unit (1000a) as shown in FIG. 2, for example. Frame unit (1000a) is structured with frame sections (13a, 13b) and multiple wiring board sections (11a~11d) (each corresponding to wiring board 10) formed in an integrated fashion. Wiring board sections (11a~11d) are each connected to frame sections (13a, 13b) by bridges 12. Wiring board sections (11a~11d) each have accommodation section (R1), and wiring board 20 is accommodated in each accommodation section (R1).

In the present embodiment, connection portions (bridges 12) between wiring board sections (11a~11d) (wiring boards 10) and frame sections (13a, 13b) are made narrow so that they are easier to cut. Since wiring board 1000 is connected to frame sections (13a, 13b), handling of wiring board 1000 is easier. The present embodiment shows an example in which multiple wiring boards 1000 are connected to a frame. However, one wiring board 1000 may be connected to a frame.

Figure 3:
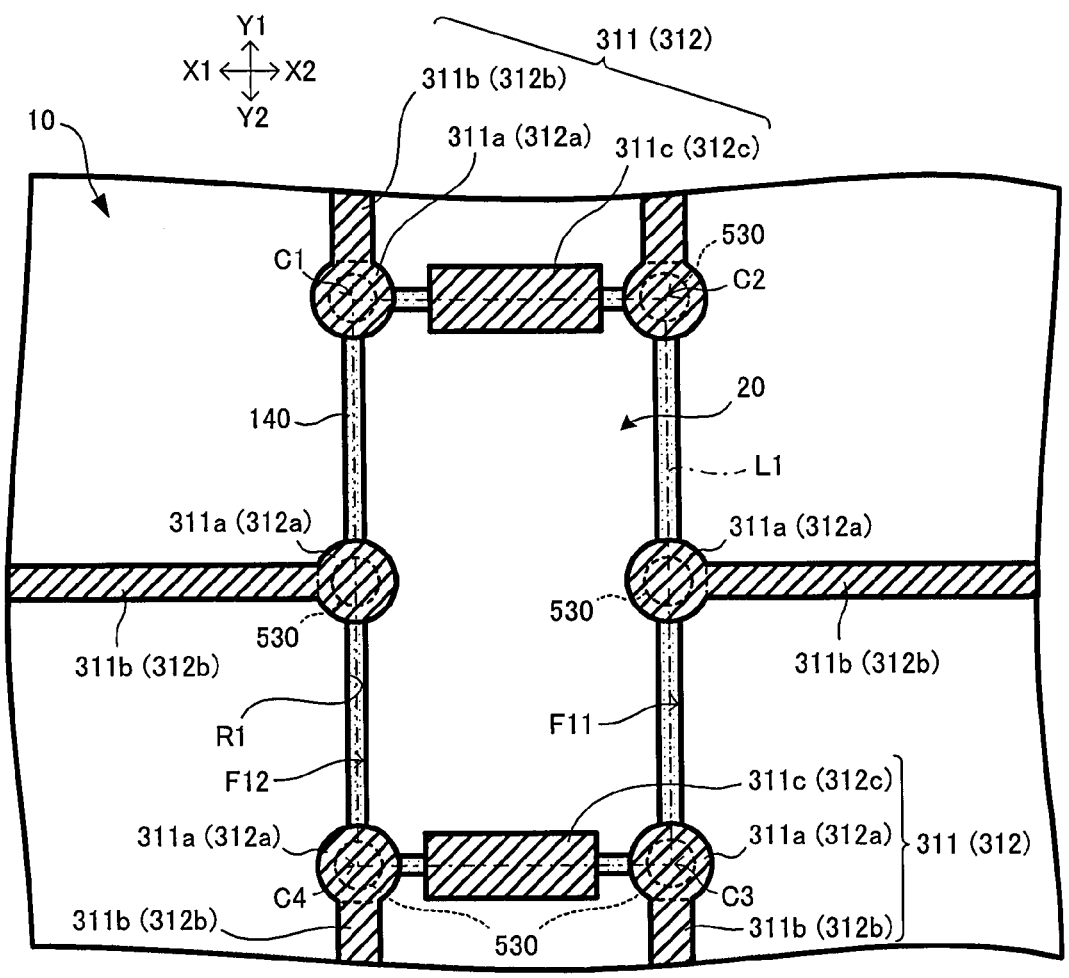
FIG. 3 is a view showing an inner-layer structure of the wiring board according to the embodiment of the present invention.

FIG. 3 shows an inner-layer structure of wiring board 1000 according to the present embodiment. The shape of wiring board 20 built into wiring board 1000 is substantially rectangular, for example, as shown in FIGS. 1~3. However, that is not the only option, and the shape of wiring board 20 may be determined freely.

Figure 4:
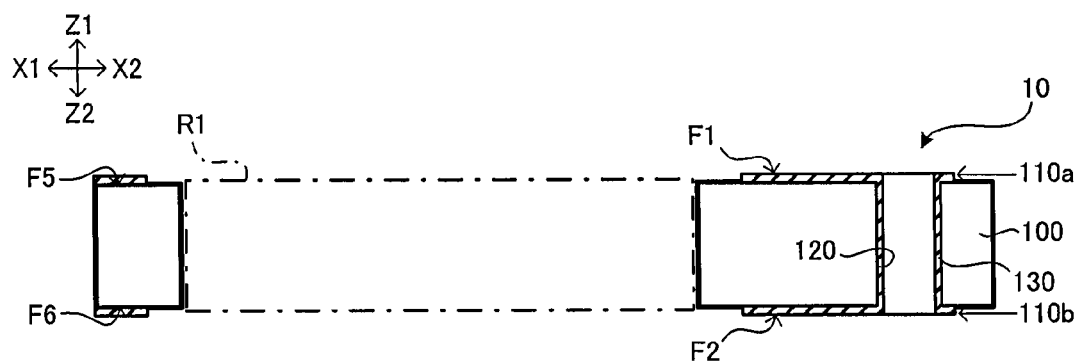
FIG. 4 is a view showing a first rigid wiring board of the wiring board according to the embodiment of the present invention.

As shown in FIG. 4, wiring board 10 (first rigid wiring board) has insulative substrate 100 (the core substrate of wiring board 10) and conductive layers (110a, 110b). In the following, one (Z1 side) of upper and lower surfaces (two main surfaces) of substrate 100 is referred to as fifth surface (F5) and the other (Z2 side) as sixth surface (F6).

Conductive layer (110a) is formed on fifth surface (F5) of substrate 100, and conductive layer (110b) is formed on sixth surface (F6) of substrate 100. Holes that penetrate through substrate 100 (accommodation section (R1) and through hole 120) are formed in substrate 100. Accommodation section (R1) has a shape that corresponds to wiring board 20 (substantially a rectangular sheet, for example). In addition, by forming copper-plated film, for example, on the wall surface of through hole 120, through-hole conductor 130 is formed. Conductive layer (110a) and conductive layer (110b) are electrically connected to each other by through-hole conductor 130. The shape of through hole 120 is columnar, for example.

Figure 5:
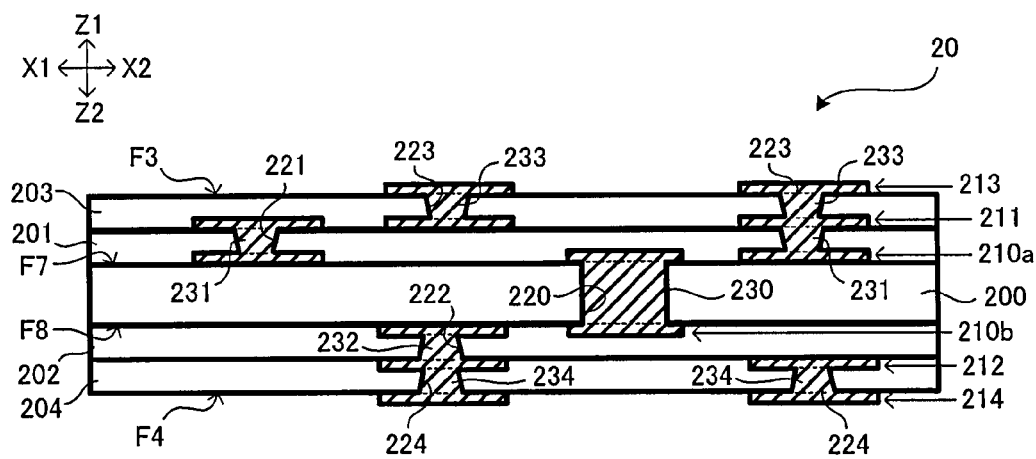
FIG. 5 is a view showing a second rigid wiring board of the wiring board according to the embodiment of the present invention.

As shown in FIG. 5, wiring board 20 (second rigid wiring board) has insulative substrate 200 (the core substrate of wiring board 20), conductive layers (210a, 210b, 211~214), and insulation layers (201~204). In the following, one (Z1 side) of upper and lower surfaces (two main surfaces) of substrate 200 is referred to as seventh surface (F7) and the other (Z2 side) as eighth surface (F8).

Conductive layer (210a) is formed on seventh surface (F7) of substrate 200, and conductive layer (210b) is formed on eighth surface (F8) of substrate 200. Insulation layers (201, 203) and conductive layers (211, 213) are alternately laminated on seventh surface (F7) of substrate 200, and insulation layers (202, 204) and conductive layers (212, 214) are alternately laminated on eighth surface (F8) of substrate 200.

Through hole 220 which penetrates through substrate 200 is formed in substrate 200, and through-hole conductor 230 (filled conductor) is formed by filling through hole 220 with copper plating, for example. Via holes (221, 223) are respectively formed in insulation layers (201, 203), and via conductors (231, 233) (each a filled conductor) are formed by filling via holes (221, 223) with copper plating, for example. Also, via holes (222, 224) are respectively formed in insulation layers (202, 204), and via conductors (232, 234) (each a filled conductor) are formed by filling via holes (222, 224) with copper plating, for example.

As shown in FIG. 1, wiring board 20 is accommodated in accommodation section (R1) of wiring board 10, insulation layer 301 is formed on first surface (F1) of wiring board 10 and on third surface (F3) of wiring board 20, and insulation layer 302 is formed on second surface (F2) of wiring board 10 and on fourth surface (F4) of wiring board 20. Conductive layer 311 is formed on insulation layer 301, and conductive layer 312 is formed on insulation layer 302.

Via holes (321a, 321b) are formed in insulation layer 301, and via conductors (331a, 331b) (each a filled conductor) are formed by filling via holes (321a, 321b) with copper plating, for example. Also, via holes (322a, 322b) are formed in insulation layer 302, and via conductors (332a, 332b) (each a filled conductor) are formed by filling via holes (322a, 322b) with copper plating, for example. Via conductors (331a, 332a) are formed in their respective regions directly on wiring board 10, and via conductors (331b, 332b) are formed in their respective regions directly on wiring board 20.

Wiring board 1000 of the present embodiment has stacked-conductor structures (S1, S2) on and under the core substrate (substrate 200) of wiring board 20, for example.

Wiring board 1000 has solder resist 401 on the outermost layer (insulation layer 301 and conductive layer 311) on one side, and solder resist 402 on the outermost layer (insulation layer 302 and conductive layer 312) on the other side. Opening portions (411a, 411b) are formed in solder resist 401 and portions of the outermost conductive layer (conductive layer 311) are exposed through opening portions (411a, 411b) and become pads. Then, external connection terminals (421a, 421b) made of solder, for example, are formed respectively on the pads exposed through opening portions (411a, 411b). Also, opening portions (412a, 412b) are formed in solder resist 402 and portions of the outermost conductive layer (conductive layer 312) are exposed through opening portions (412a, 412b) and become pads. Then, external connection terminals (422a, 422b) made of solder, for example, are formed respectively on the pads exposed through opening portions (412a, 412b). External connection terminals (421a, 422a) are formed in their respective regions directly on wiring board 10, and external connection terminals (421b, 422b) are formed in their respective regions directly on wiring board 20.

Since wiring boards (10, 20) in wiring board 1000 of the present embodiment are both rigid wiring boards, it is easier to secure wiring board 20 by friction when wiring board 20 is accommodated in accommodation section (R1).

In the present embodiment, wiring board 20 (second rigid wiring board) has smaller external dimensions than wiring board 10 (first rigid wiring board) and is accommodated in accommodation section (R1) of wiring board 10. The number of conductive layers (two layers) in wiring board 10 (first rigid wiring board) is less than the number of conductive layers (six layers) in wiring board 20 (second rigid wiring board). Namely, the number of conductive layers included per unit thickness is greater in wiring board 20 than in wiring board 10. As a result, the density of existing conductors in wiring board 20 is higher than the density of existing conductors in wiring board 10. According to such a structure, the conductor density of wiring board 1000 is increased partially (to make high-density wiring). The number of layers in the second rigid wiring board may be seven or greater. The first rigid wiring board may have three or more layers, or it may have buildup layers.

In the present embodiment, wiring board 10 (first rigid wiring board) and wiring board 20 (second rigid wiring board) are electrically connected to each other by via conductors (331a, 331b) and conductive layer 311, or by via conductors (332a, 332b) and conductive layer 312.

Wiring board 1000 of the present embodiment has external connection terminals (421a, 422a) and (421b, 422b) respectively in regions directly on wiring board 10 (first rigid wiring board) and in regions directly on wiring board 20 (second rigid wiring board). External connection terminals (421a, 422a, 421b, 422b) are used for electrical connection with another wiring board, an electronic component or the like, for example. Wiring board 1000 may be used as a circuit board for mobile equipment (such as a cell phone) or the like by being mounted on another wiring board on one of its surfaces or both of its surfaces, for example.

Substrates (100, 200) are each made by impregnating, for example, glass cloth (core material) with epoxy resin (hereinafter referred to as glass epoxy). The core material has a lower thermal expansion coefficient than primary material (epoxy resin in the present embodiment). Inorganic material such as glass fiber (glass cloth or glass non-woven fabric, for example), aramid fiber (aramid non-woven fabric, for example), or silica filler is considered preferable as core material. However, the material of substrates (100, 200) is basically determined freely. For example, polyester resin, bismaleimide triazine resin (BT resin), imide resin (polyimide), phenol resin, allyl polyphenylene ether resin (A-PPE resin) or the like may also be used instead of epoxy resin. Each substrate may be formed with multiple layers made of different materials.

Insulation layers in wiring board 1000 are each made of glass epoxy, for example. However, that is not the only option, and the material of insulation layers is basically determined freely. For example, polyester resin, bismaleimide triazine resin (BT resin), imide resin (polyimide), phenol resin, allyl polyphenylene ether resin (A-PPE resin) or the like may also be used instead of epoxy resin. Each insulation layer may be formed with multiple layers made of different materials.

Through-hole conductors and via conductors in wiring board 1000 are each made of copper plating, for example. The shape of through-hole conductors is a column or a cylinder, for example. The shape of via conductors is a tapered column (truncated cone), for example. Via conductors formed in a buildup section taper with a diameter that increases from the core substrate toward the upper layer, for example. However, those are not the only options, and the shape of via conductors may be determined freely.

Conductive layers in wiring board 1000 are each formed with copper foil (lower layer) and copper plating (upper layer). Those conductive layers include, for example, wiring (inner-layer wiring) that forms electronic circuits, a land, a planar conductive pattern to enhance the strength or flatness of the wiring board, or the like. A tear-drop treatment is preferred to be conducted at the connected portion of a land and wiring.

The material of each conductive layer and each via conductor is not limited specifically as long as it is conductive. It may be metallic or non-metallic. Each conductive layer and each via conductor may be formed with multiple layers made of different materials.

Solder resists in wiring board 1000 are each made of resin such as photosensitive resin using acrylic epoxy resin, thermosetting resin mainly containing epoxy resin or UV curable resin.

Figure 6A:
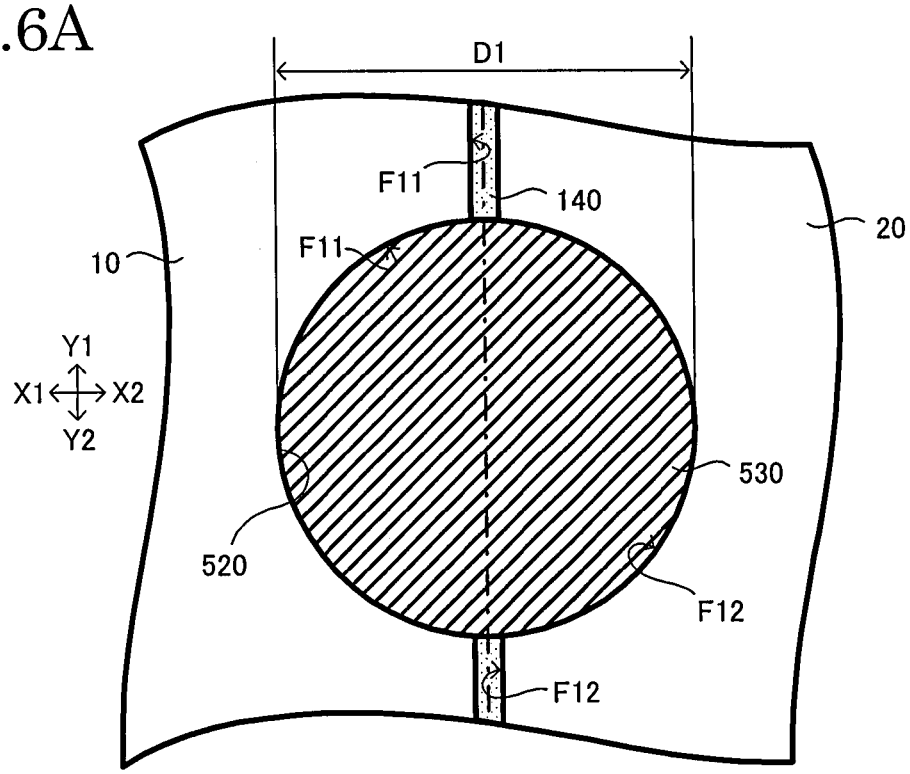
FIG. 6A is a plan view of a through-hole conductor (joint conductor) in a wiring board according to the embodiment of the present invention.

Wiring board 1000 of the present embodiment has through-hole conductor 530 (joint conductor). As shown in FIG. 3, multiple through-hole conductors 530 are positioned, for example, along boundary line (L1) between wiring board 10 and wiring board 20. More specifically, through-hole conductors 530 are positioned in all corners (C1~C4) of wiring board 20, and through-hole conductors 530 are also positioned on sides of wiring board 20 (for example, between corner (C2) and corner (C3), and between corner (C1) and corner (C4)) in the present embodiment. As shown in FIGS. 1 and 6A, each through-hole conductor 530 is formed in through hole 520 which penetrates through both wiring boards (10, 20), and connects side surface (F11) of wiring board 10 and side surface (F12) of wiring board 20. Accordingly, connected portions of wiring board 10 and wiring board 20 are reinforced by being joined by through-hole conductors 530, and cracking seldom occurs when external force caused by impact from being dropped or the like is exerted. Also, when cracking occurs, such cracking is thought to be suppressed from spreading because cracking tends to be blocked by through-hole conductors 530. The diameter of the land of a joint conductor may be set greater than the land of a regular interlayer connection conductor.

In addition, heat dissipation in wiring board 1000 improves by through-hole conductor 530.

Through-hole conductor 530 (joint conductor) may be used only for heat dissipation. However, through-hole conductor 530 is also used electrically in the present embodiment. Namely, conductive layer 311 and conductive layer 312 are electrically connected to each other by through-hole conductor 530. Since through-hole conductor 530 is easy to set wide, it is preferred to be connected to power source or ground.

Figure 6B:
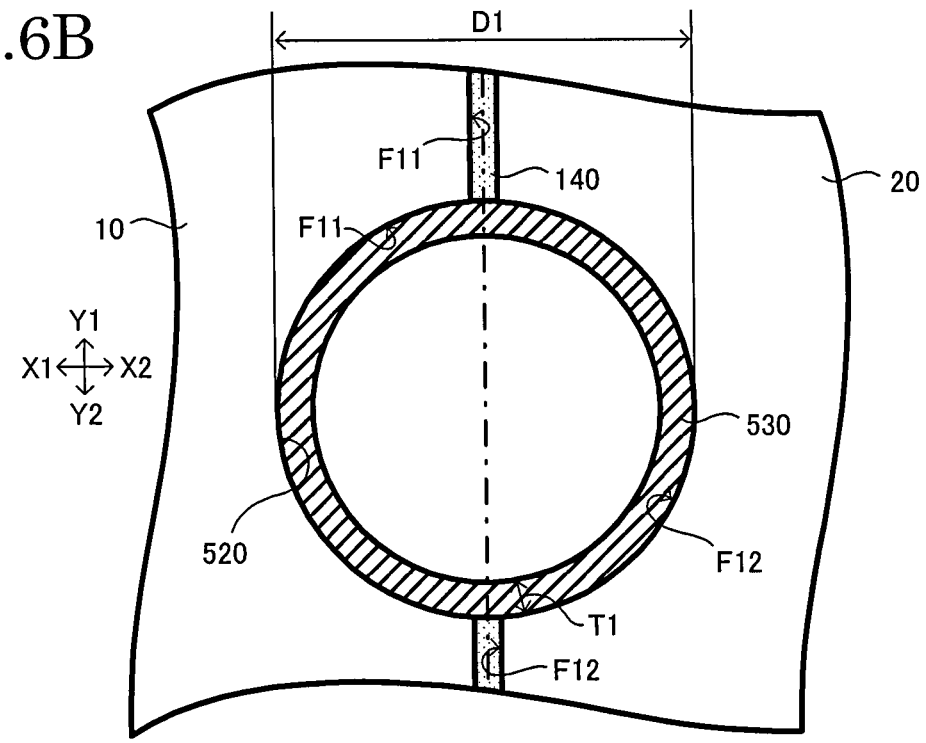
FIG. 6B is a plan view showing another example of the through-hole conductor (joint conductor) shown in FIG. 6A.

In the present embodiment, through-hole conductor 530 (joint conductor) is a filled conductor. However, that is not the only option, and through-hole conductor 530 may also be a conformal conductor as shown in FIG. 6B, for example.

Diameter (D1) of through hole 520 (the hole for a joint conductor) is 500 for example Thickness (T1) of through-hole conductor 530 set as a conformal conductor is 15 µm, for example.

In the present embodiment, side surface (F11) of wiring board 10 (wall surface of accommodation section (R1)) and side surface (F12) of wiring board 20 intersect substantially perpendicular to main surfaces of wiring board 1000 (X-Y plane, for example). Also, at least either stacked-conductor structure (S1) or (S2) (stacked-conductor structure (S1), for example) is positioned near through-hole conductor 530. Because of a stacked-conductor structure formed by stacking filled conductors, strength in the vicinity of through-hole conductor 530 is enhanced.

Through hole 520 penetrates through insulation layers (301, 302) as well as wiring board 10 (first rigid wiring board) and wiring board 20 (second rigid wiring board). Both ends of through-hole conductor 530 (joint conductor) are connected respectively to the outermost conductive layers (conductive layers (311, 312)) of wiring board 1000. Through-hole conductor 530 is made by filling through hole 520 with copper plating, for example. By using the same material for through-hole conductor 530 as that for via conductors (331a, 331b, 332a, 332b), it is easier to form them simultaneously. As a result, manufacturing efficiency improves.

In the present embodiment, insulator 140 made of resin, for example, is filled in a gap between wiring board 10 and wiring board 20 as shown in FIGS. 3 and 6A. Insulator 140 is filled in a gap between wiring board 10 and wiring board 20 when resin flows out from insulation layer 301 or 302, for example. However, that is not the only option, and any material may be used to form insulator 140 separately.

Figure 7A:
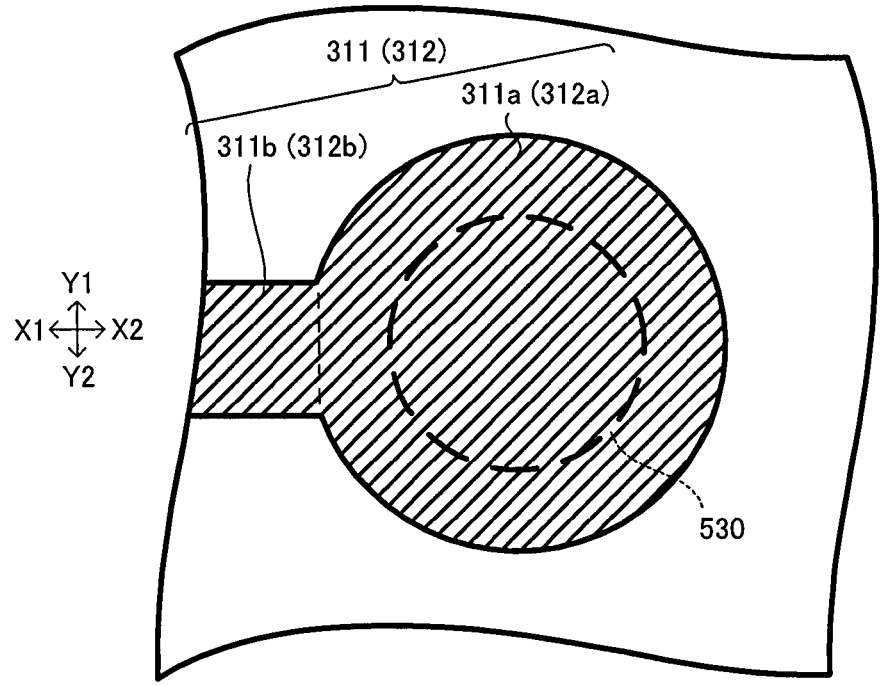
FIG. 7A is a plan view of a land connected to a through-hole conductor (joint conductor) in a wiring board according to the embodiment of the present invention.

In the present embodiment, planar conductive film (in particular, lands (311a, 312a)) is formed on a boundary portion (boundary line (L1)) between wiring board 10 and wiring board 20 as shown in FIGS. 3 and 7A. Then, both ends of through-hole conductor 530 are respectively connected to lands (311a, 312a) as shown in FIGS. 1 and 7A. Accordingly, connection by through-hole conductor 530 at a connected portion of wiring board 10 and wiring board 20 is strengthened.

Figure 7B:
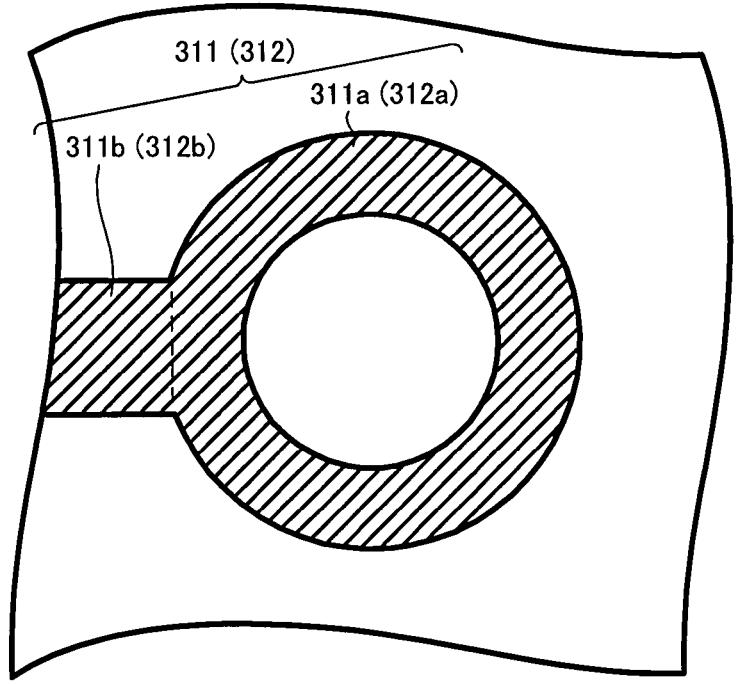
FIG. 7B is a plan view showing another example of the land shown in FIG. 7A.

In the present embodiment, lands (311a, 312a) are made of planar conductive film. However, that is not the only option, and as shown in FIG. 7B, for example, through-hole conductor 530 set to be a conformal conductor may be connected to ring-shaped lands (311a, 312a).

Also, in the present embodiment, planar conductive films (311c, 312c) are formed directly on a boundary portion (boundary line (L1)) between wiring board 10 and wiring board 20 as shown in FIG. 3. Conductive films (311c, 312c) are extended along boundary line (L1) between wiring board 10 and wiring board 20, for example. More specifically, conductive films (311c, 312c) each have a rectangular planar shape (on the X-Y plane), positioned on sides of wiring board 20 (between corner (C1) and corner (C2) and between corner (C3) and corner (C4), for example), and the directions parallel to the sides are their longitudinal directions. Conductive films (311c, 312c) are each connected to ground, for example.

Land (311a), wiring (311b) connected to that land, and conductive film (311c) are each included in conductive layer 311. Land (312a), wiring (312b) connected to that land, and conductive film (312c) are each included in conductive layer 312.

In the present embodiment, through-hole conductor 530 (joint conductor), conductors in wiring board 10 (through-hole conductors and conductive layers), conductors in wiring board 20 (through-hole conductors, via conductors, conductive layers) are all made of the same material (such as copper). In doing so, it is easier to form each conductor.

In the following, a method for manufacturing wiring board 1000 according to the present embodiment is described.

When manufacturing wiring board 1000 of the present embodiment, first, wiring board 10 and wiring board 20 are respectively manufactured.

Figure 8A:
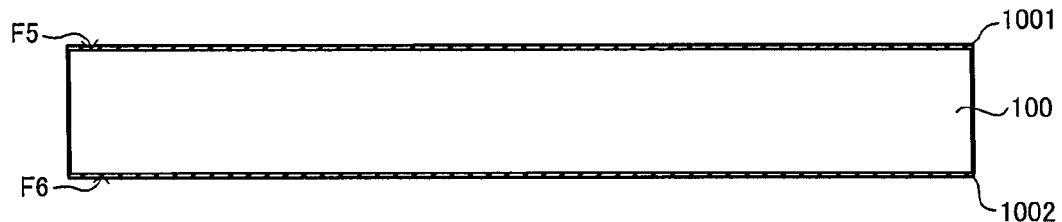
FIG. 8A is a view to illustrate a first step for manufacturing a first rigid wiring board in a method for manufacturing a wiring board according to the embodiment of the present invention.
Figure 8B:
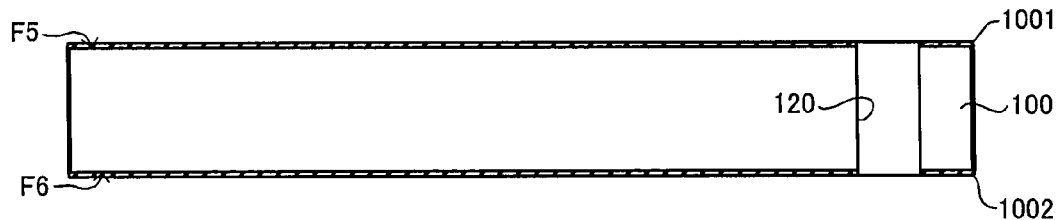
FIG. 8B is a view to illustrate a second step subsequent to the step in FIG. 8A.

To manufacture wiring board 10, first, substrate 100 having copper foil 1001 on fifth surface (F5) and copper foil 1002 on sixth surface (F6) is prepared as shown in FIG. 8A, for example. A copper-clad laminate may be used, for example, as such starting material. As shown in FIG. 8B, a drill or a laser, for example, is used to form through hole 120. Then, desmearing is conducted if required.

Figure 8C:
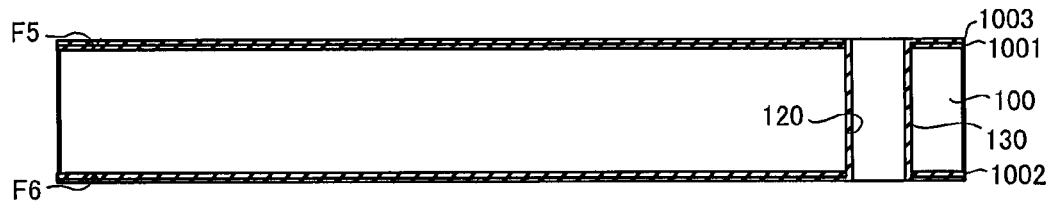
FIG. 8C is a view to illustrate a third step subsequent to the step in FIG. 8B.

Panel plating is performed (such as chemical copper plating and copper electroplating). Accordingly, plated film 1003 is formed on copper foils (1001, 1002) and in through hole 120 as shown in FIG. 8C. Plated film 1003 formed on the wall surface of through hole 120 becomes through-hole conductor 130.

Figure 8D:
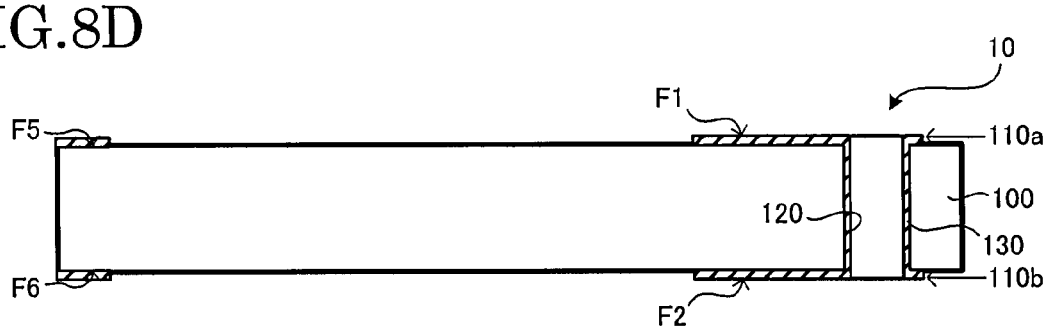
FIG. 8D is a view to illustrate a fourth step subsequent to the step in FIG. 8C.

Using photo-etching techniques (acid cleansing, resist lamination, exposure and development, etching, film removal, and the like), for example, conductive layers formed on fifth surface (F5) and sixth surface (F6) of substrate 100 are each patterned. In doing so, conductive layers (110a, 110b) are formed as shown in FIG. 8D. Accordingly, wiring board 10 is completed.

Figure 9:
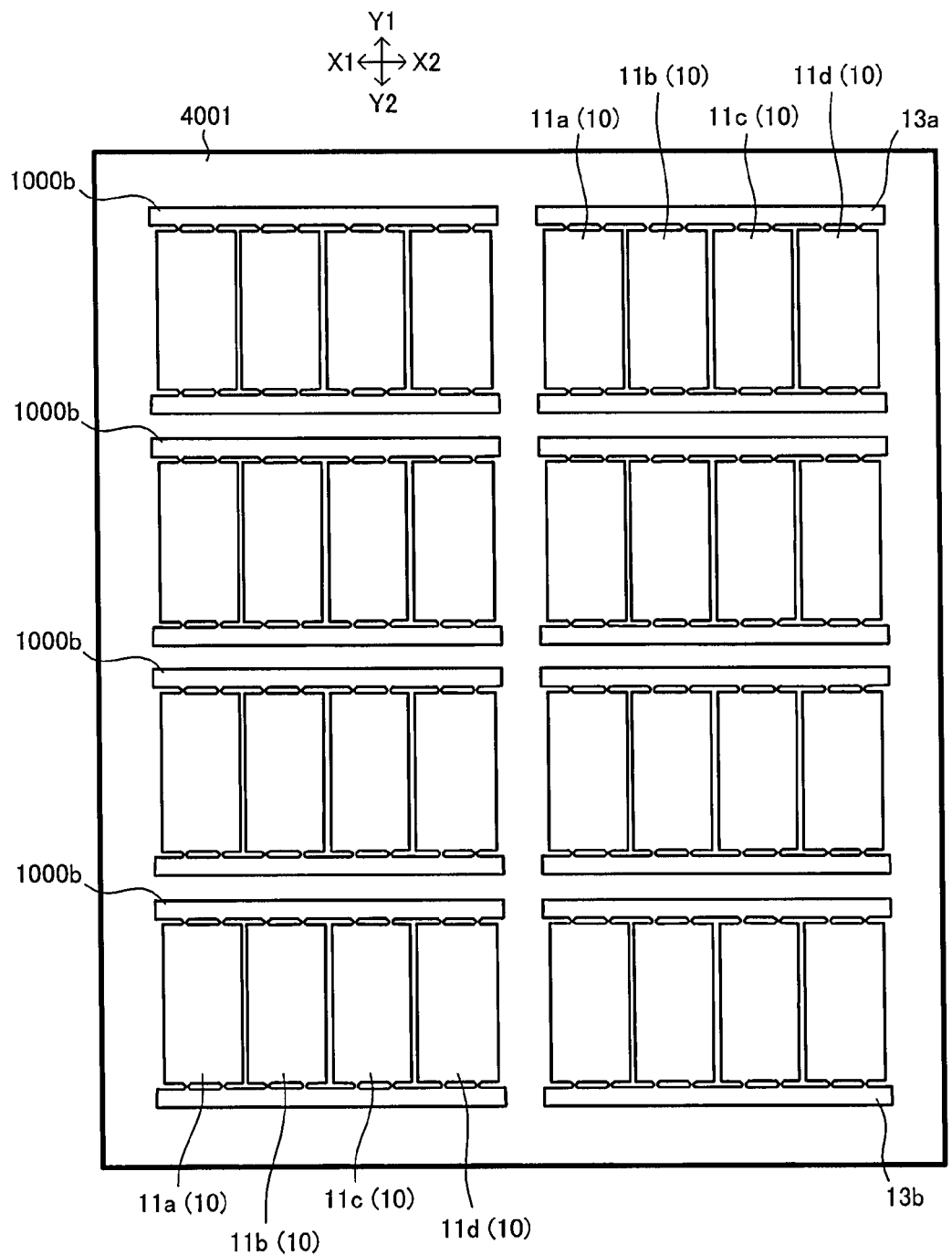
FIG. 9 is, in the method for manufacturing a wiring board according to the embodiment of the present invention, a view showing an example in which multiple first rigid wiring boards are formed collectively.

In the present embodiment, multiple frame units (1000b) (frame units (1000a) prior to accommodating wiring boards 20) are formed collectively in one panel 4001 as shown in FIG. 9. Frame units (1000b) are each formed with multiple wiring boards 10 set in an integrated fashion (see FIG. 2).

Figure 10A:
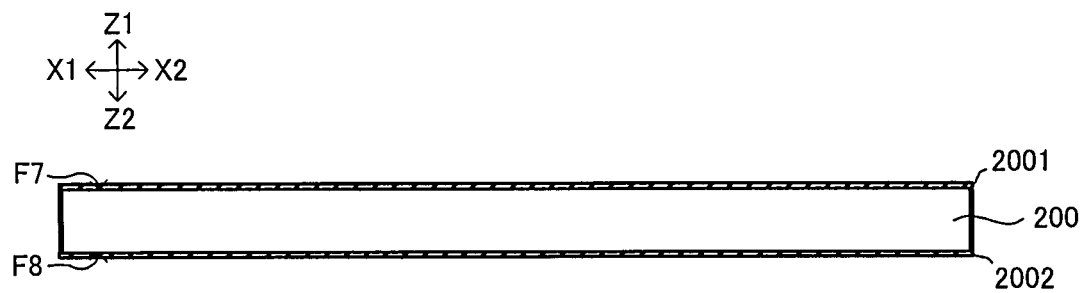
FIG. 10A is, in the method for manufacturing a wiring board according to the embodiment of the present invention, a view to illustrate a first step for manufacturing a second rigid wiring board.
Figure 10B:
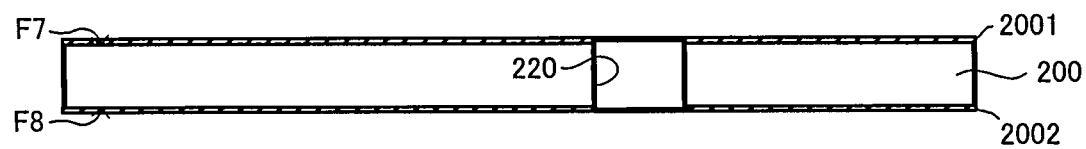
FIG. 10B is a view to illustrate a second step subsequent to the step in FIG. 10A.

On the other hand, when manufacturing wiring board 20, substrate 200 having copper foil 2001 on seventh surface (F7) and copper foil 2002 on eighth surface (F8) is first prepared as shown in FIG. 10A, for example. A copper-clad laminate is used for such starting material, for example. Using a drill or a laser, for example, through hole 220 is formed as shown in FIG. 10B. Then, desmearing is conducted if required.

Figure 10C:
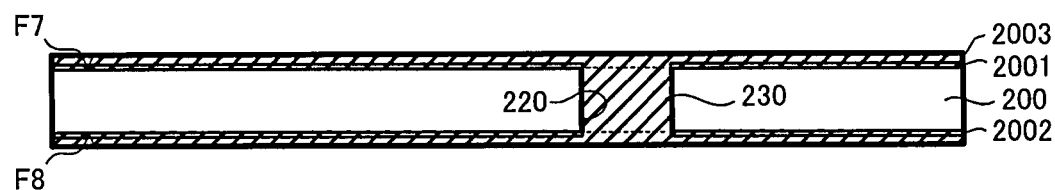
FIG. 10C is a view to illustrate a third step subsequent to the step in FIG. 10B.

Panel plating (such as chemical copper plating and copper electroplating) is conducted. In doing so, plating 2003 is formed on copper foils (2001, 2002) and in through hole 220 as shown in FIG. 10C. Plating 2003 filled in through hole 220 becomes through-hole conductor 230.

Figure 10D:
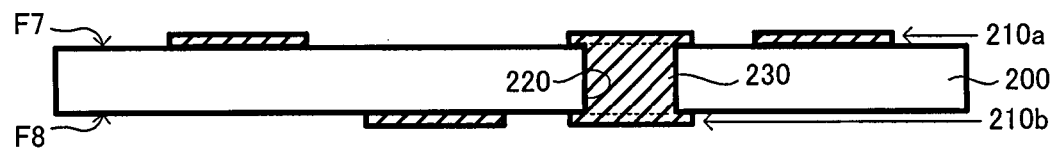
FIG. 10D is a view to illustrate a fourth step subsequent to the step in FIG. 10C.

Using photo-etching techniques (acid cleansing, resist lamination, exposure and development, etching, film removal, and the like), for example, conductive layers formed on seventh surface (F7) and eighth surface (F8) of substrate 200 are each patterned. In doing so, conductive layers (210a, 210b) are formed as shown in FIG. 10D. After that, surfaces of conductive layers (210a, 210b) are roughened if required.

Figure 11A:
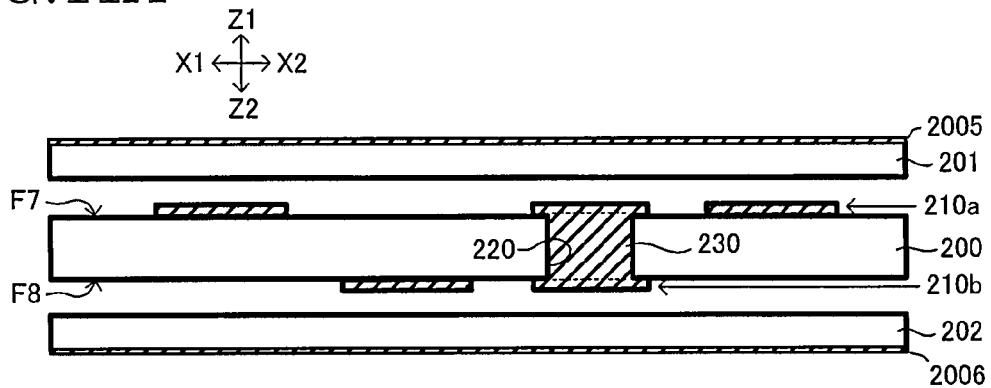
FIG. 11A is a view to illustrate a fifth step subsequent to the step in FIG. 10D.

As shown in FIG. 11A, insulation layer 201 having copper foil 2005 is positioned on seventh surface (F7) of substrate 200, and insulation layer 202 having copper foil 2006 is positioned on eighth surface (F8) of substrate 200. Insulation layers (201, 202) are each made of prepreg, for example.

Using hydraulic pressing equipment, for example, outer copper foils (2005, 2006) are pressurized. Specifically, pressing and thermal treatments are conducted simultaneously. Through thermal pressing, insulation layers (201, 202) are pressed in directions Z, prepreg (insulation layers (201, 202)) is cured, and insulation layers (201, 202) and substrate 200 are adhered. As a result, the laminate becomes integrated. Pressing and thermal treatments may be divided into multiple procedures. In addition, thermal and pressing treatments may be conducted separately, but it is more efficient if they are conducted simultaneously. After thermal pressing, another thermal treatment for integration may be conducted separately.

Figure 11B:
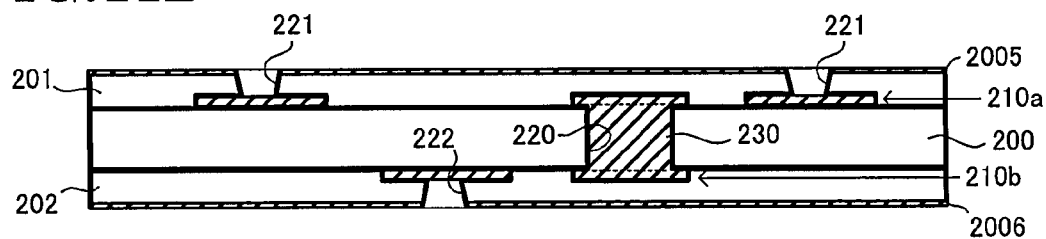
FIG. 11B is a view to illustrate a sixth step subsequent to the step in FIG. 11A.

As shown in FIG. 11B, a laser, for example, is used to form via hole 221 in insulation layer 201 and via hole 222 in insulation layer 202. Then, desmearing is conducted if required.

Figure 11C:
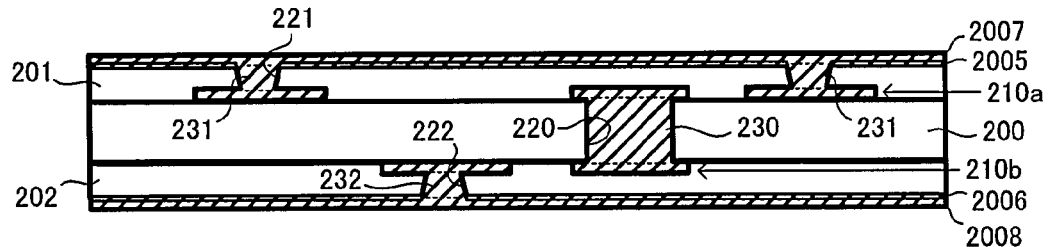
FIG. 11C is a view to illustrate a seventh step subsequent to the step in FIG. 11B.

Panel plating (such as chemical copper plating and copper electroplating) is conducted, for example. Accordingly, platings (2007, 2008) are formed respectively on copper foils (2005, 2006) and in via holes (221, 222) as shown in FIG. 11C. Platings (2007, 2008) filled in via holes (221, 222) respectively become via conductors (231, 232).

Figure 11D:
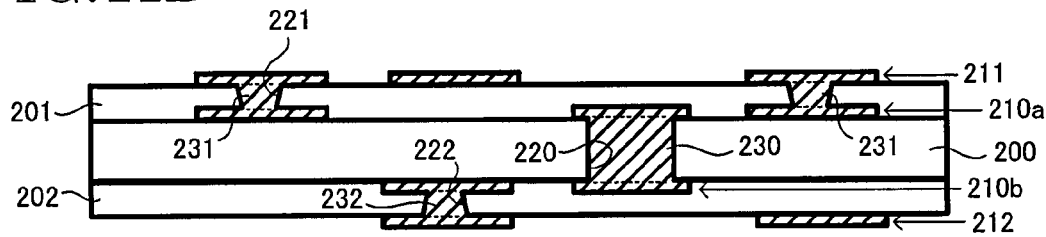
FIG. 11D is a view to illustrate an eighth step subsequent to the step in FIG. 11C.

Using photo-etching techniques (acid cleansing, resist lamination, exposure and development, etching, film removal, and the like), for example, conductive layers formed on insulation layers (201, 202) are each patterned. Accordingly, conductive layers (211, 212) are formed as shown in FIG. 11D. Then, surfaces of conductive layers (211, 212) are roughened if required.

Figure 12A:
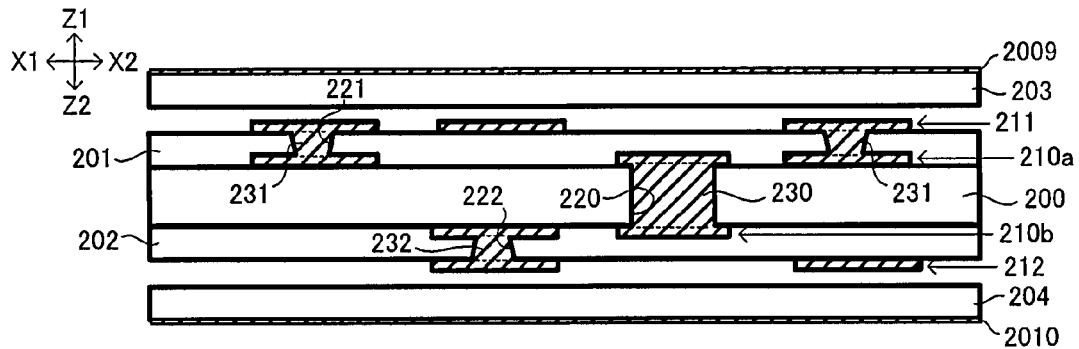
FIG. 12A is a view to illustrate a ninth step subsequent to the step in FIG. 11D.

As shown in FIG. 12A, insulation layer 203 with copper foil 2009 is positioned on insulation layer 201 and conductive layer 211, and insulation layer 204 with copper foil 2010 is positioned on insulation layer 202 and conductive layer 212. Insulation layers (203, 204) are each made of prepreg, for example. RCF (resin-coated copper foil) may be used instead of prepreg.

Using hydraulic pressing equipment, for example, outer copper foils (2009, 2010) are pressurized the same as in the first layers (insulation layers (201, 202)), for example. Accordingly, insulation layers (203, 204) are pressed, and insulation layers (203, 204) and substrate 200 are adhered to be integrated.

Figure 12B:
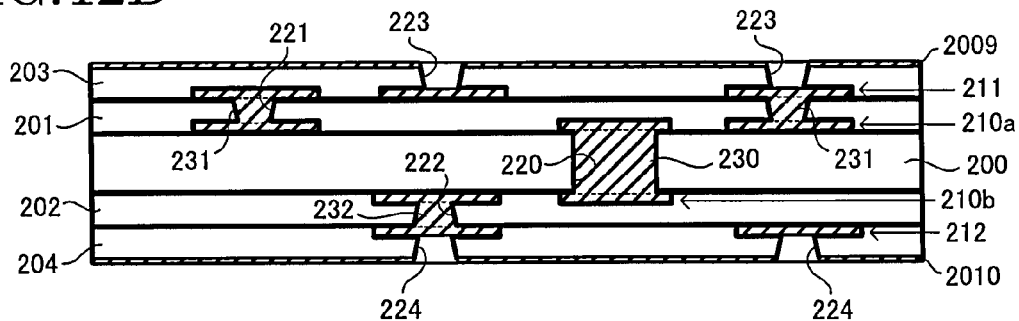
FIG. 12B is a view to illustrate a 10th step subsequent to the step in FIG. 12A.

A laser, for example, is used to form via hole 223 in insulation layer 203 and via hole 224 in insulation layer 204, as shown in FIG. 12B. Then, desmearing is conducted if required.

Figure 12C:
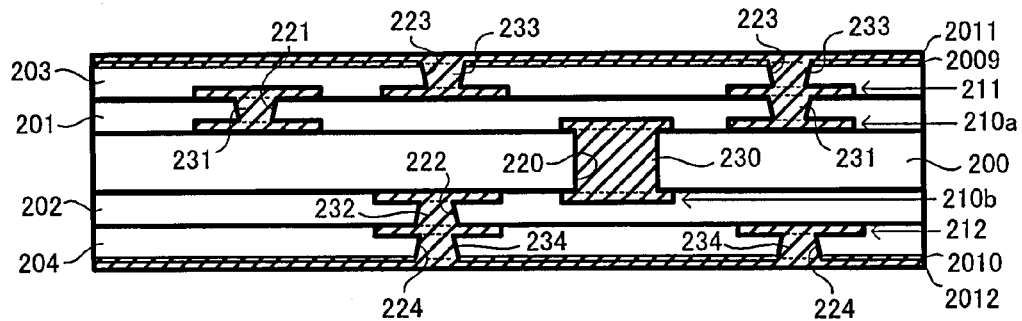
FIG. 12C is a view to illustrate an 11th step subsequent to the step in FIG. 12B.

Panel plating (chemical copper plating and copper electroplating, for example) is performed, for example. Accordingly, platings (2011, 2012) are formed respectively on copper foils (2009, 2010) and in via holes (223, 224) as shown in FIG. 12C. Platings (2011, 2012) filled in via holes (223, 224) become via conductors (233, 234) respectively.

Figure 12D:
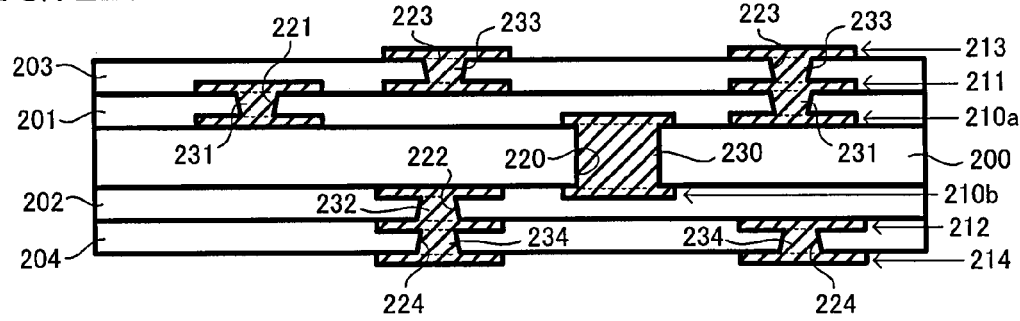
FIG. 12D is a view to illustrate a 12th step subsequent to the step in FIG. 12C.

Using photo-etching techniques (acid cleansing, resist lamination, exposure and development, etching, film removal, and the like), for example, conductive layers formed on insulation layer 203 and insulation layer 204 are each patterned. In doing so, conductive layers (213, 214) are formed as shown in FIG. 12D. Then, surfaces of conductive layers (213, 214) are roughened if required. Accordingly, wiring board 20 is completed.

Figure 13:
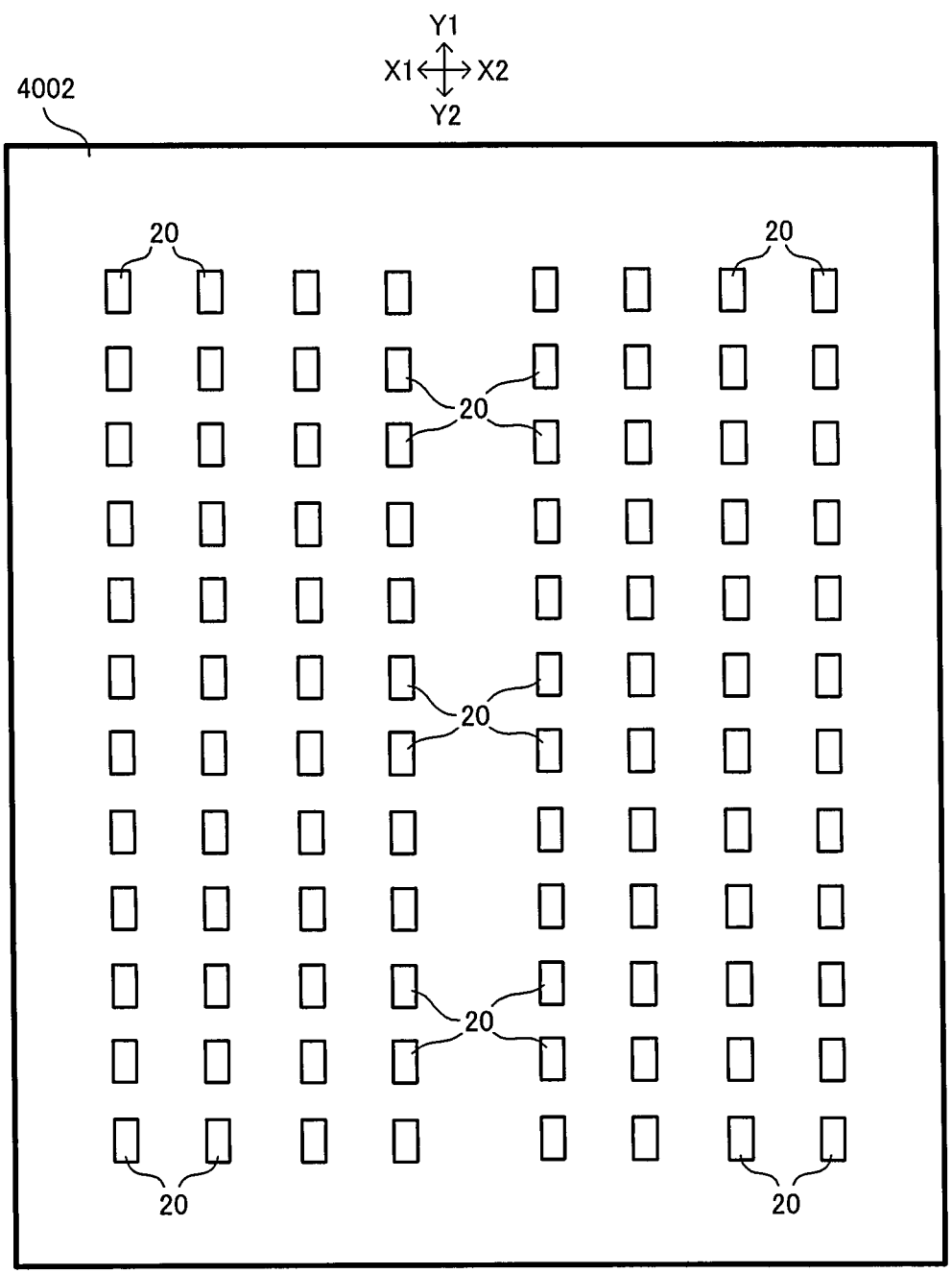
FIG. 13 is, in the method for manufacturing a wiring board according to the embodiment of the present invention, a view showing an example in which multiple second rigid wiring boards are formed collectively.

In the present embodiment, multiple wiring boards 20 are formed collectively in one panel 4002 as shown in FIG. 13.

Figure 14:
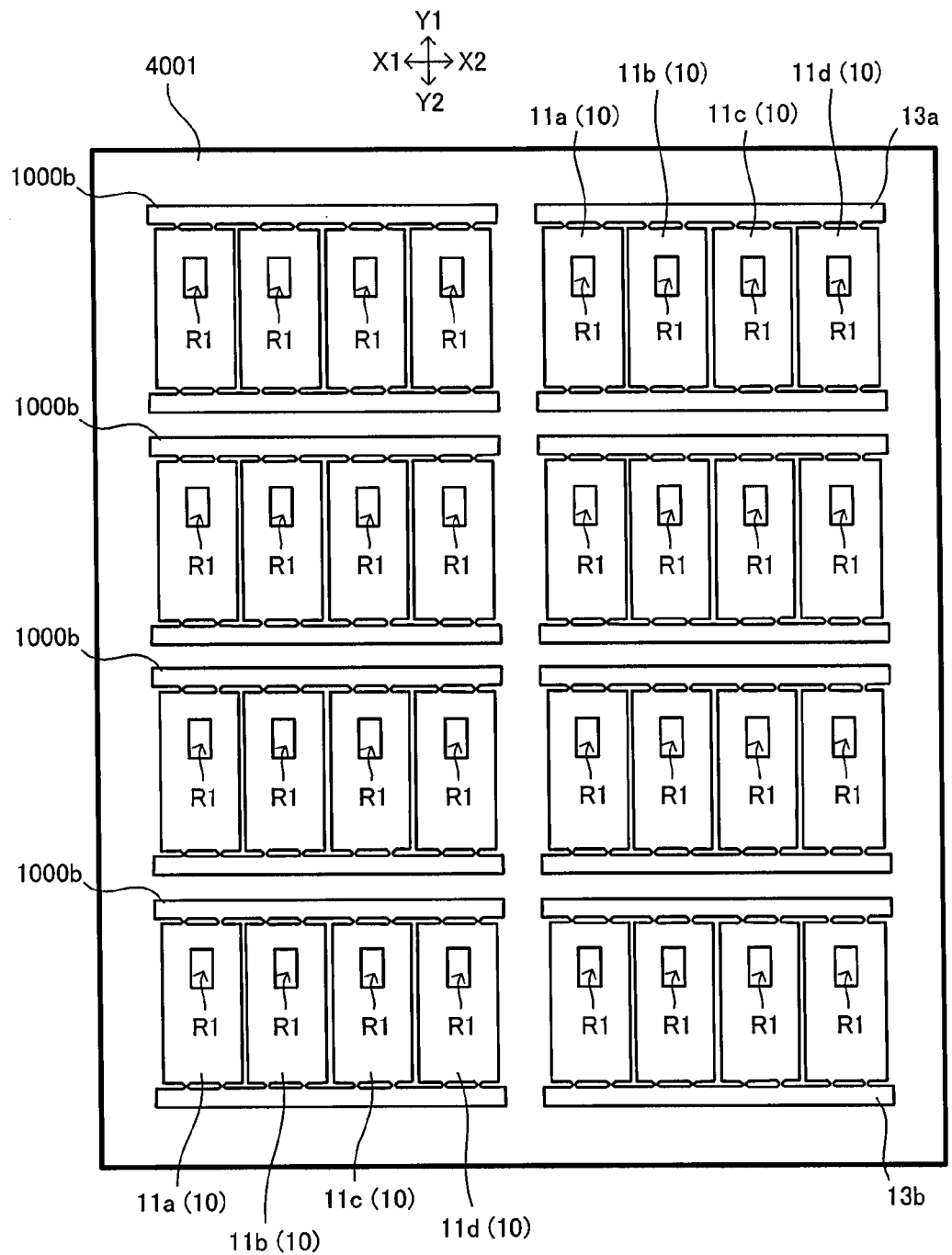
FIG. 14 is, in the method for manufacturing a wiring board according to the embodiment of the present invention, a view to illustrate a step for forming an accommodation section in a first rigid wiring board.

As shown in FIG. 14, accommodation section (R1) is formed in each of wiring boards 10 in frame units (1000b). Accommodation section (R1) is formed by cutting wiring board 10 using a laser or a die, for example. However, that is not the only option, and accommodation section (R1) may be formed by any other method. For example, wiring board 10 may be cut using a router to form accommodation section (R1).

When forming accommodation section (R1), it is preferred that alignment marks (such as conductive patterns) readable by X rays be formed in four corners of wiring board 10, and accommodation section (R1) be formed at a predetermined position based on the alignment marks. Also, deburring may be conducted on cut surfaces if required.

Figure 15A:
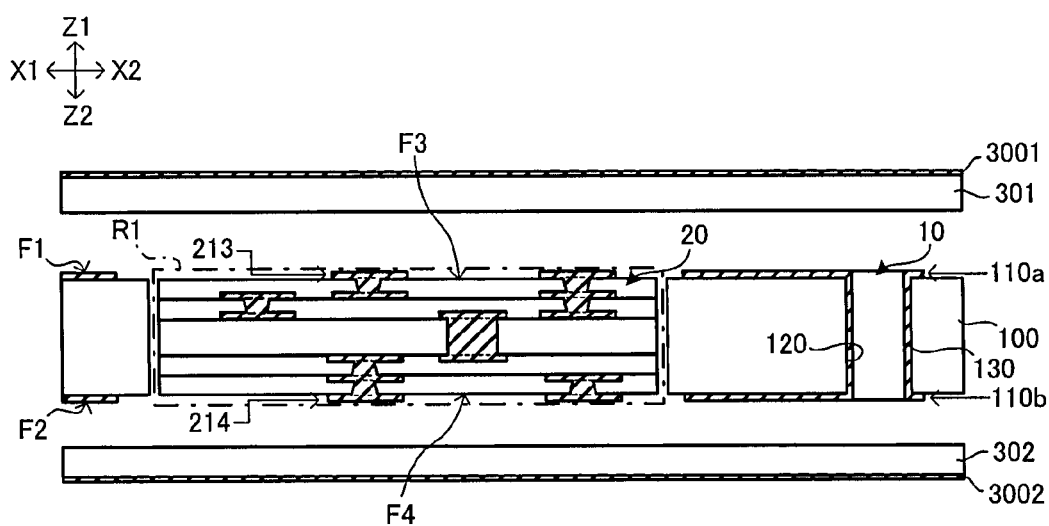
FIG. 15A is, in the method for manufacturing a wiring board according to the embodiment of the present invention, a view to illustrate a step for positioning a second rigid wiring board in the accommodation section of a first rigid wiring board.

Wiring board 20 is positioned in accommodation section (R1) of wiring board 10 (see FIG. 15A). Then, wiring board 20 is preliminarily secured if required. At that time, if the exterior dimensions of wiring board 20 are substantially the same as those of accommodation section (R1), wiring board 20 is preliminarily secured by friction when fit to the accommodation section. Alternatively, wiring board 20 may be preliminarily secured using adhesives or the like.

As shown in FIG. 15A, insulation layer 301 with copper foil 3001 is positioned on first surface (F1) of wiring board 10 and on third surface (F3) of wiring board 20, and insulation layer 302 with copper foil 3002 is positioned on second surface (F2) of wiring board 10 and on fourth surface (F4) of wiring board 20. Insulation layers (301, 302) are each made of prepreg, for example.

Using hydraulic pressing equipment, for example, outer copper foils (3001, 3002) are pressurized. Specifically, pressing and thermal treatments are conducted simultaneously. Through the thermal pressing, insulation layers (301, 302) are pressed in directions Z, prepreg (insulation layers (301, 302)) is cured, and insulation layers (301, 302) and wiring boards (10, 20) are adhered. As a result, the laminate becomes integrated. Also, resin of each insulation layer flows out from insulation layers (301, 302) by pressing and is filled in through hole 120. The resin filled in through hole 120 becomes insulator 140 (see FIG. 15B). Pressing and thermal treatments may be conducted by being divided into multiple treatments. Also, thermal and pressing treatments may be conducted separately, but it is more efficient if they are conducted simultaneously. After thermal pressing, another thermal treatment for integration may be conducted separately.

Figure 15B:
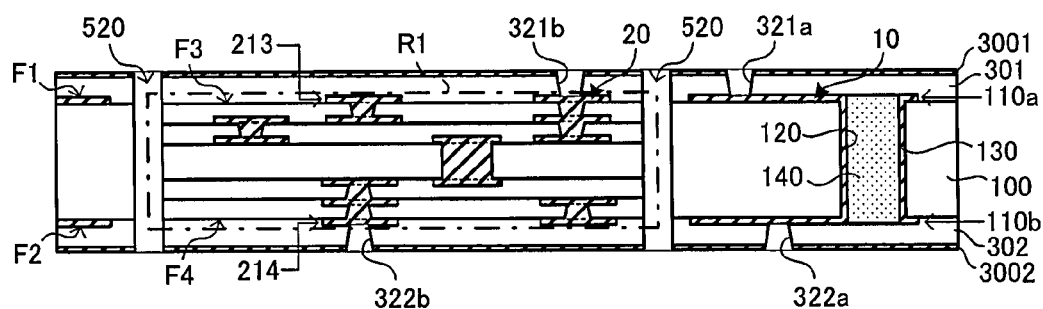
FIG. 15B is, in the method for manufacturing a wiring board according to the embodiment of the present invention, a step to illustrate a step for forming a via hole and a hole for a joint conductor.

As shown in FIG. 15B, a laser is used, for example, to form via holes (321a, 321b) in insulation layer 301 and via holes (322a, 322b) in insulation layer 302. Through hole 520 which penetrates through the entire laminate (wiring boards (10, 20), insulation layers (301, 302) and copper foils (3001, 3002)) is further formed. Via holes (321a, 321b, 322a, 322b) and through hole 520 may be formed simultaneously or separately. Those via holes and through hole may be formed by any method. For example, through hole 520 may be formed using a drill. After through hole 520 is formed, desmearing is conducted if required.

Figure 16A:
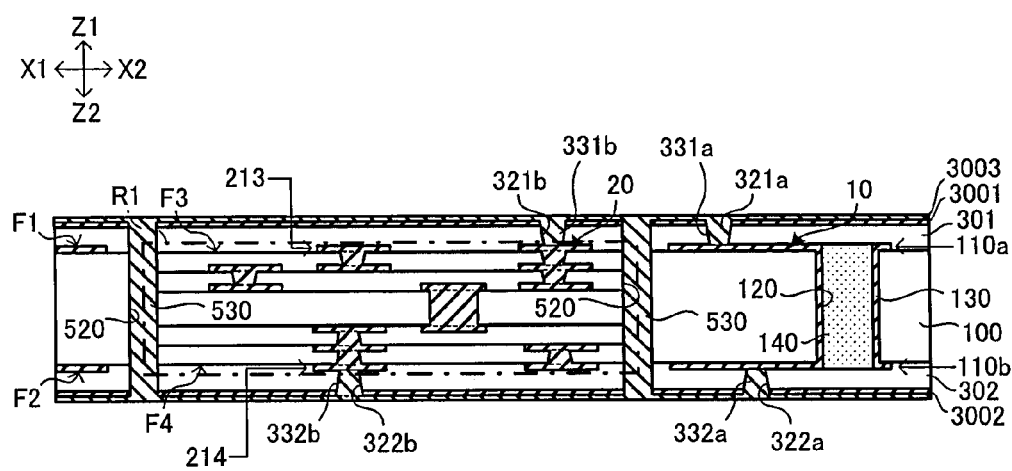
FIG. 16A is, in the method for manufacturing a wiring board according to the embodiment of the present invention, a view to illustrate a step for filling conductor in the via hole and the hole for a joint conductor.

Panel plating (such as chemical copper plating and copper electroplating) is performed, for example. Accordingly, plating 3003 is formed on copper foils (3001, 3002), in via holes (321a, 321b) and in through hole 520 as shown in FIG. 16A. Plating 3003 filled in via holes (321a, 321b) respectively becomes via conductors (331a, 331b), and plating 3003 filled in via holes (322a, 322b) respectively becomes via conductors (332a, 332b). Also, plating 3003 filled in through hole 520 becomes through-hole conductor 530 (joint conductor).

Figure 16B:
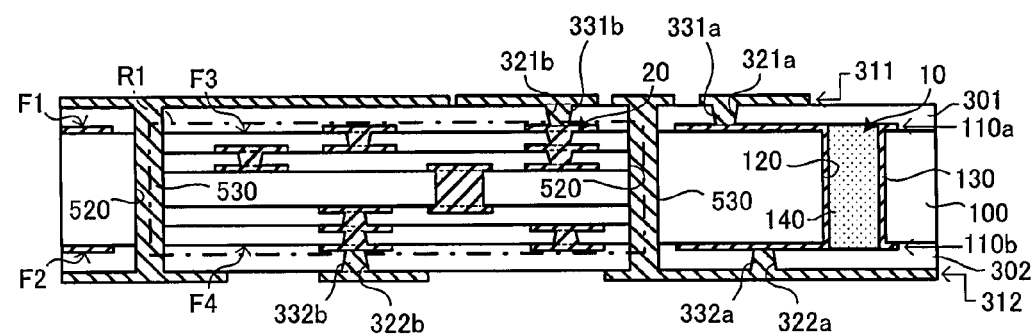
FIG. 16B is, in the method for manufacturing a wiring board according to the embodiment of the present invention, a view to illustrate a step for patterning conductive layers connected to both ends of the joint conductor.

Using photo-etching techniques (acid cleansing, resist lamination, exposure and development, etching, film removal, and the like), for example, conductive layers formed on insulation layers (301, 302) are each patterned. In doing so, conductive layers (311, 312) are formed as shown in FIG. 16B. Conductive layer 311 and conductive layer 312 are electrically connected to each other by through-hole conductor 530. Specifically, lands (311a, 312a) (FIG. 7A) are connected to both ends of through-hole conductor 530. Then, surfaces of conductive layers (311, 312) are roughened if required.

By screen printing, spray coating, roll coating or the like, for example, solder resist 401 having opening portions (411a, 411b) is formed on insulation layer 301 and on conductive layer 311, and solder resist 402 having opening portions (412a, 412b) is formed on insulation layer 302 and on conductive layer 312 (see FIG. 1). Accordingly, portions of conductive layer 311 are exposed through opening portions (411a, 411b) and portions of conductive layer 312 are exposed through opening portions (412a, 412b) (see FIG. 1).

External connection terminals (421a, 421b, 422a, 422b) are formed respectively in opening portions (411a, 411b, 412a, 412b) (see FIG. 1). Those external connection terminals are formed, for example, by applying solder paste and by curing the paste through thermal treatments such as reflow.

Through the above procedures, wiring board 1000 (FIG. 1) is completed, which includes wiring board 10 (first rigid wiring board) having accommodation section (R1), wiring board 20 (second rigid wiring board) accommodated in accommodation section (R1), and insulation layers (301, 302) formed on wiring boards (10, 20). Wiring board 1000 has through-hole conductor 530 (joint conductor) formed in through hole 520 which penetrates through both wiring board 10 and wiring board 20 and which connects side surface (F11) of wiring board 10 and side surface (F12) of wiring board 20. Conductors in wiring board 10 and conductors in wiring board 20 are electrically connected to each other in wiring board 1000.

In the manufacturing method according to the present embodiment, wiring board 20, having high-density wiring whose manufacturing procedures are complex, is manufactured separately from wiring board 10. Therefore, wiring board 20 is inspected before being accommodated in accommodation section (R1) of wiring board 10 so that only non-defective wiring board 20 is accommodated in accommodation section (R1) of wiring board 10. As a result, the production yield of wiring boards 1000 improves.

The present invention is not limited to the embodiment above. For example, the present invention may be modified as follows.

Figure 17:
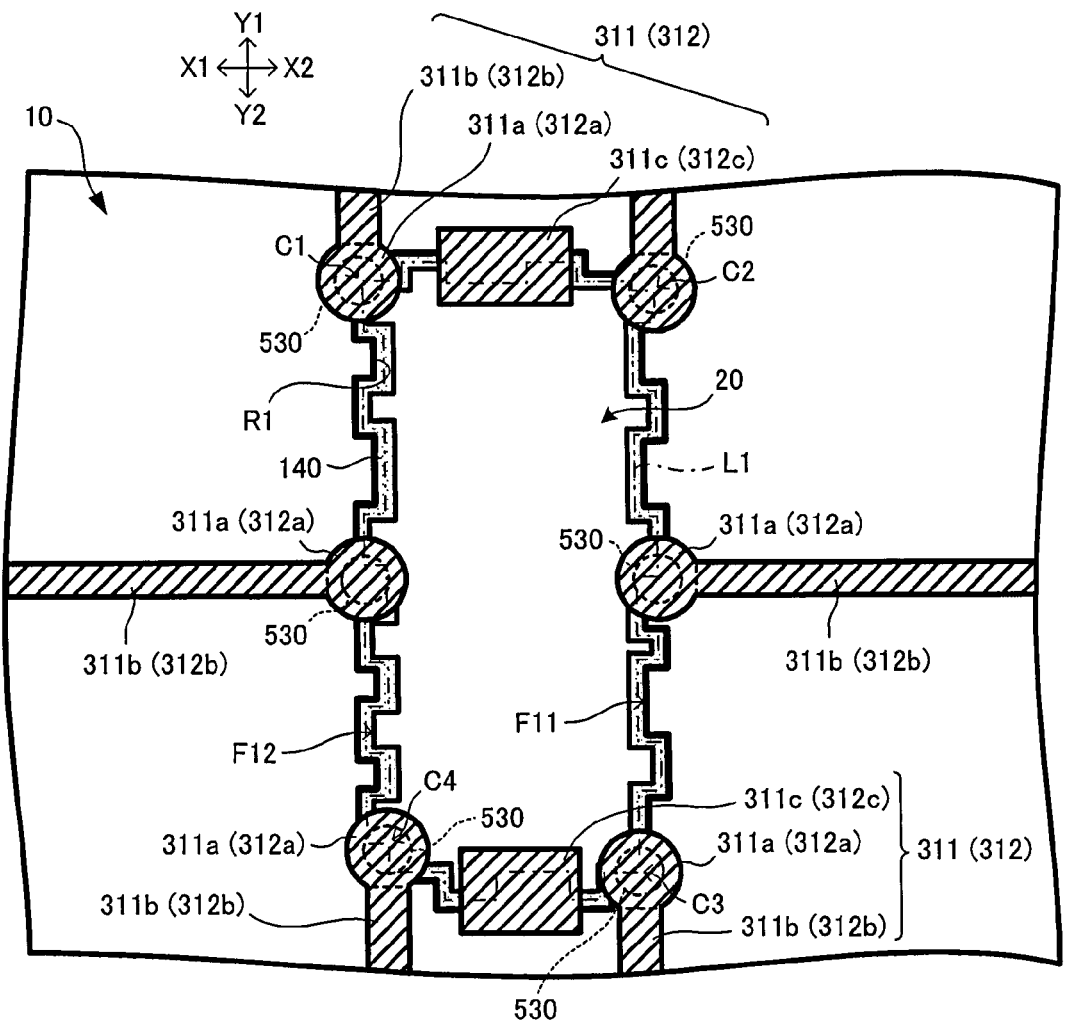
FIG. 17 is, in another embodiment of the present invention, a view showing an example in which a wall surface of the accommodation section in a first rigid wiring board and a side surface of a second rigid wiring board are formed in a zigzag pattern.

As shown in FIG. 17, side surface (F11) (wall surface of accommodation section (R1)) of wiring board 10 (first rigid wiring board) and side surface (F12) of wiring board 20 (second rigid wiring board) may be formed in a zigzag pattern. In the example shown in FIG. 17, the entire side surface (F12) of wiring board 20 has a zigzag pattern. Side surface (F11) of wiring board 10 (wall surface of accommodation section (R1)), which faces side surface (F12) of wiring board 20, has a concavo-convex shape corresponding to the convex-concave shape of side surface (F12) of wiring board 20. A concave portion faces a convex portion, and a convex portion faces a concave portion. Therefore, the periphery of accommodation section (R1) substantially corresponds to the external shape of wiring board 20. A zigzag pattern means a concave portion and convex portion are alternately positioned in series.

Figure 18A:
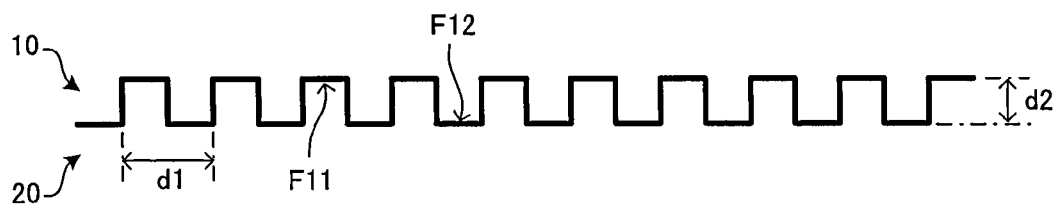
FIG. 18A is, in yet another embodiment of the present invention, a view showing a first example of the zigzag pattern.
Figure 18B:
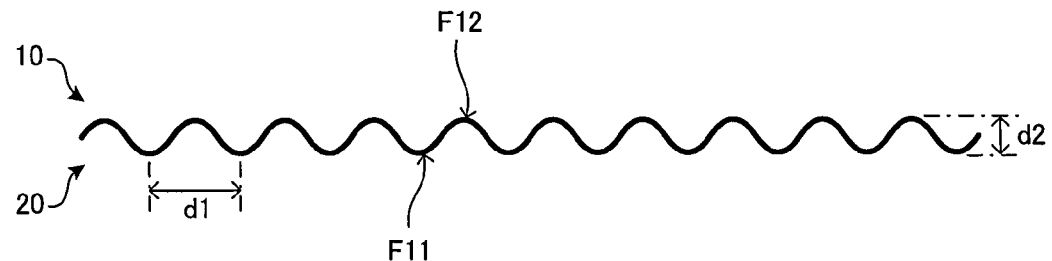
FIG. 18B is, in yet another embodiment of the present invention, a view showing a second example of the zigzag pattern.
Figure 18C:
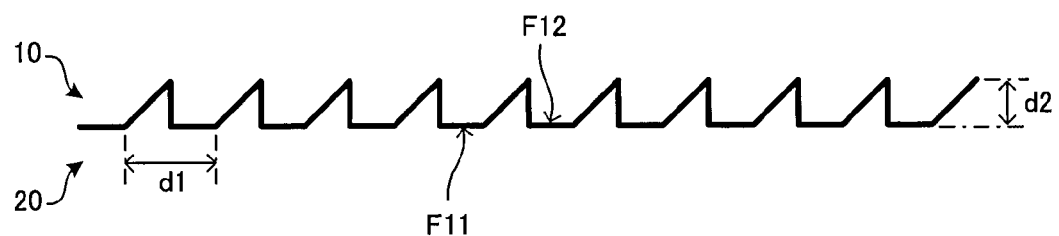
FIG. 18C is, in yet another embodiment of the present invention, a view showing a third example of the zigzag pattern.

The cycle of a zigzag pattern and the size of a concavo-convex shape may be constant or variable. Also, a concavo-convex shape is not limited specifically. For example, as shown in FIG. 18A, the concavo-convex line may be such that rectangles are connected in series (rectangular wave or trapezoidal wave, for example). Alternatively, as shown in FIG. 18B, the concavo-convex line may be an arc line (sine wave, for example). Yet alternatively, as shown in FIG. 18C, the concavo-convex line may be such that triangles are connected in series (sawtooth wave, for example). Cycle (d1) of a concavo-convex shape is preferred to be 1.0 mm, for example (the width of a concave and the width of a convex is each 0.5 mm, for example). Also, amplitude (d2) of a concavo-convex shape is preferred to be 0.5 mm, for example.

Figure 19A:
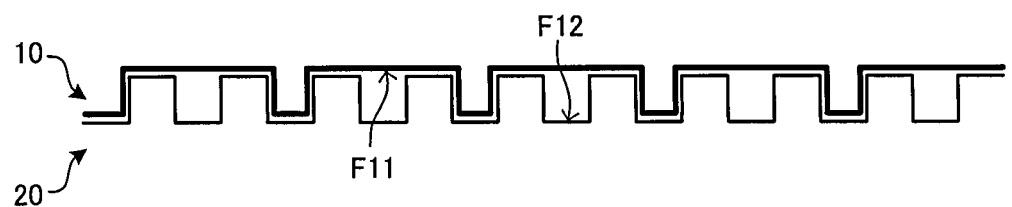
FIG. 19A is, in yet another embodiment of the present invention, a view showing a fourth example of the zigzag pattern.
Figure 19B:
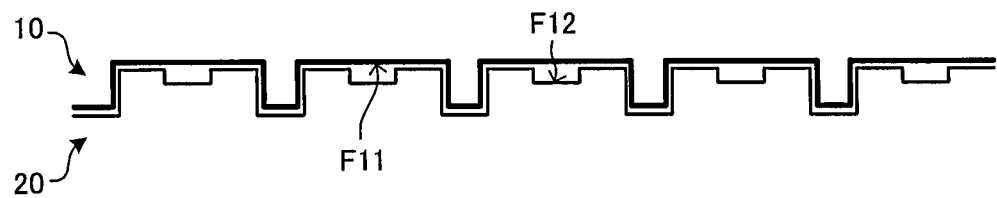
FIG. 19B is, in yet another embodiment of the present invention, a view showing a fifth example of the zigzag pattern.
Figure 19C:
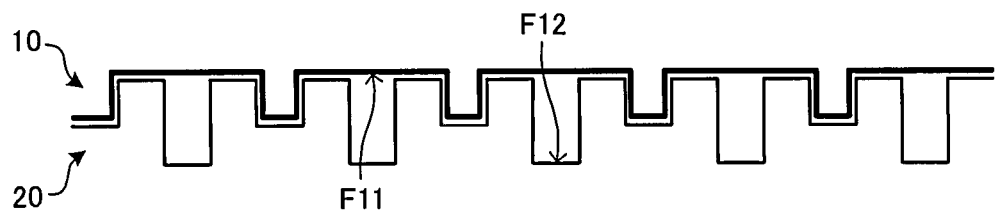
FIG. 19C is, in yet another embodiment of the present invention, a view showing a sixth example of the zigzag pattern.

As shown in FIG. 19A~19C, for example, multiple convex portions may be positioned in one concave portion. Also, the concavo-convex shape may be deeper or shallower. Moreover, the number of concave and convex portions may be determined freely, and the concavo-convex cycle may be constant or variable.

Figure 20:
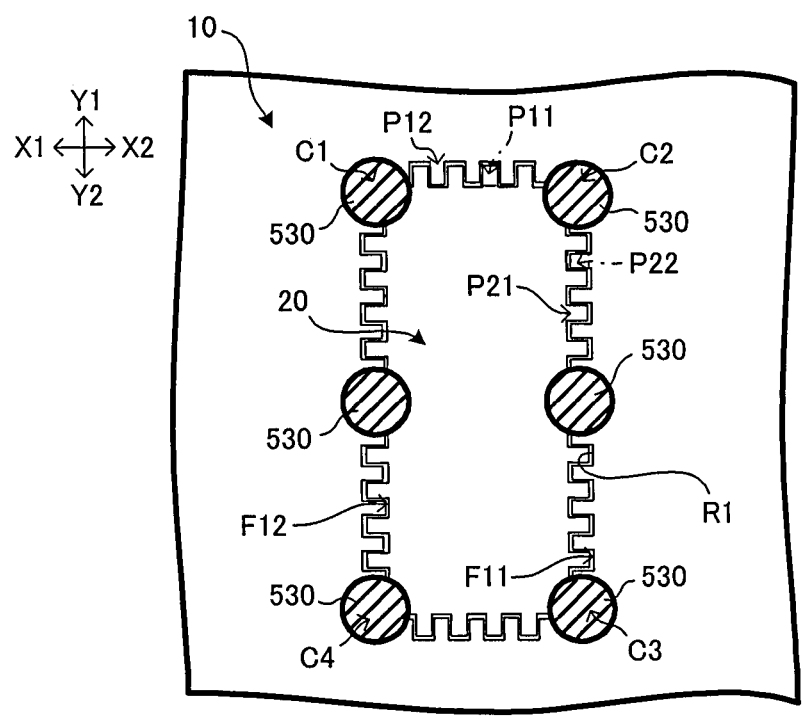
FIG. 20 is, in yet another embodiment of the present invention, a view showing an example in which a second concavo-convex shape finer than a first concavo-convex shape is formed in the first concavo-convex shape formed on a wall surface of the accommodation section in a first rigid wiring board or on a side surface of a second rigid wiring board.
Figure 21A:
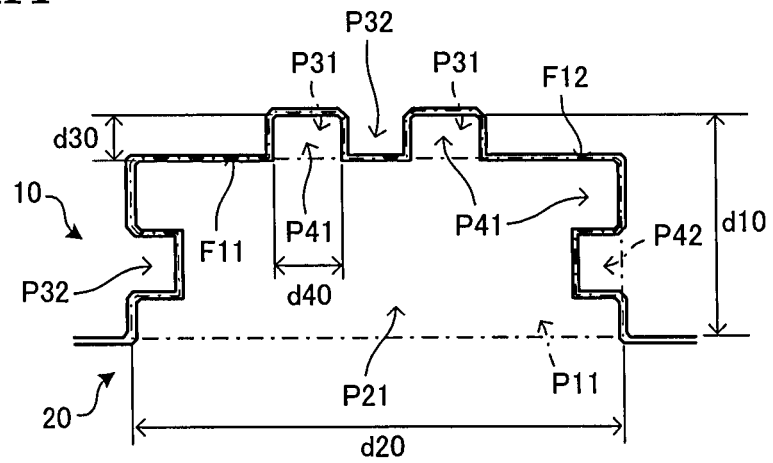
FIG. 21A is, in yet another embodiment of the present invention, a view showing an example in which a second concavo-convex shape finer than a first concavo-convex shape is formed in each concave portion and in each convex portion of the first concavo-convex shape.
Figure 21B:
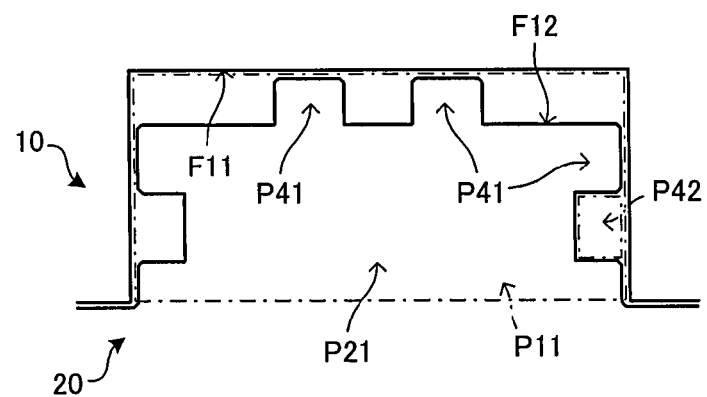
FIG. 21B is, in yet another embodiment of the present invention, a view showing an example in which a second concavo-convex shape finer than a first concavo-convex shape is formed in a convex portion of the first concavo-convex shape.
Figure 21C:
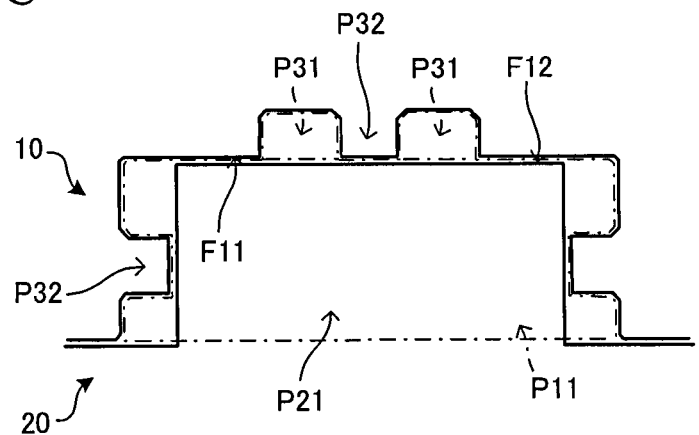
FIG. 21C is, in yet another embodiment of the present invention, a view showing an example in which a second concavo-convex shape finer than a first concavo-convex shape is formed in a concave portion of the first concavo-convex shape.

As shown in FIG. 20, a first concavo-convex shape (concave portion (P11), convex portion (P12), convex portion (P21), concave portion (P22)) may be formed on side surface (F12) of wiring board 20 (second rigid wiring board) and on wall surface (F11) of accommodation section (R1) (side surface of wiring board 10), and one convex portion (P21) formed on side surface (F12) of wiring board 20 may be inserted into one concave portion (P11) formed on wall surface (F11) of accommodation section (R1). Alternatively, as shown in FIGS. 21A~21C, a second concavo-convex shape (concave portion (P31), convex portion (P32), convex portion (P41), concave portion (P42)), which is set finer than a first concavo-convex shape (concave portion (P11), convex portion (P12), convex portion (P21), concave portion (P22)), may be formed in at least either concave portion (P11) or convex portion (P21). In examples shown in FIGS. 21A~21C, the length (amplitude) and width of the second concavo-convex shape are set shorter than the length (amplitude) and width of the first concavo-convex shape. Corners of the second concavo-convex shape are preferred to be roundish. The first concavo-convex shape and the second concavo-convex shape may be formed by the same method or by different methods.

In the example in FIG. 21A, a second concavo-convex shape (concave portion (P31), convex portion (P32), convex portion (P41), concave portion (P42)) is formed in each concave portion (P11) and in each convex portion (P21).

In the example in FIG. 21B, regarding concave portion (P11) and convex portion (P21), a second concavo-convex shape (convex portion (P41) and concave portion (P42)) is formed only in convex portion (P21).

In the example in FIG. 21C, regarding concave portion (P11) and convex portion (P21), a second concavo-convex shape (concave portion (P31) and convex portion (P32)) is formed only in concave portion (P11).

Figure 22A:
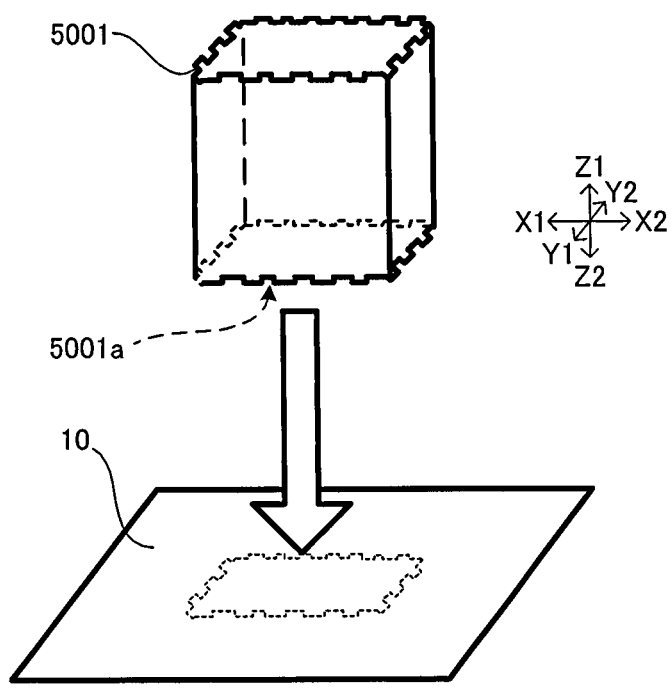
FIG. 22A is, in yet another embodiment of the present invention, a view showing an example of a method for forming a surface in a zigzag pattern by using a die.

To form the wall surface of accommodation section (R1) in a zigzag pattern, die 5001 shaped in a rectangular column is used to form accommodation section (R1) in wiring board 10 as shown in FIG. 22A, for example. The shape of opening surface (5001*a*) of die 5001 is in a zigzag pattern corresponding to the shape of accommodation section (R1). Then, die 5001 is pressed multiple times (twice, for example) to form accommodation section (R1) in wiring board 10, which corresponds to the shape of wiring board 20 based on the shape of opening surface (5001*a*) of die 5001. The material of die 5001 is steel, for example. The thickness of die 5001 is approximately 30 mm, for example.

Figure 22B:
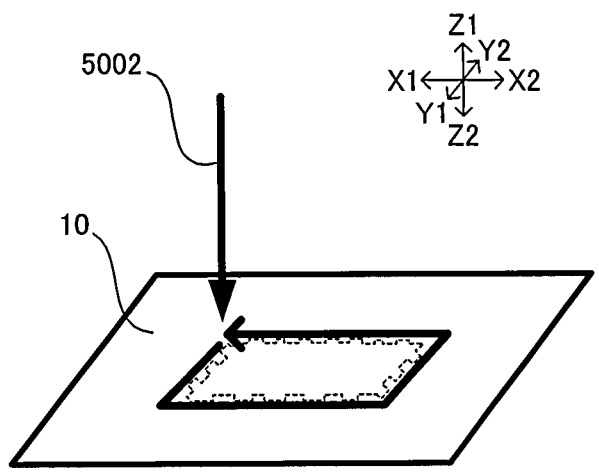
FIG. 22B is, in yet another embodiment of the present invention, a view showing an example of a method for forming a surface in a zigzag pattern by using a laser.

Alternatively, as shown in FIG. 22B, for example, laser 5002 may also be used to form accommodation section (R1). Laser 5002 is irradiated in a zigzag pattern to correspond to the shape of accommodation section (R1). By cutting out a predetermined section of wiring board 10 using laser 5002, accommodation section (R1) is formed in a zigzag pattern.

The same as the wall surface of accommodation section (R1), side surface (F12) of wiring board 20 may also be formed in a zigzag pattern by using a die or a laser, for example. The zigzag pattern of side surface (F12) of wiring board 20 may be formed to correspond to the shape of the wall surface of accommodation section (R1). The die to be used for forming wiring board 20 may the same as or different from the die to be used for forming accommodation section (R1). However, to fit them highly accurately, it is preferred to prepare a special die for each of them.

When side surface (F12) of wiring board 20 is formed in a zigzag pattern, it is preferred that alignment marks (such as conductive patterns) readable by X rays be formed in four corners of wiring board 20 and a zigzag pattern be formed based on the alignment marks. Also, deburring or the like may be conducted if required.

Figure 23A:
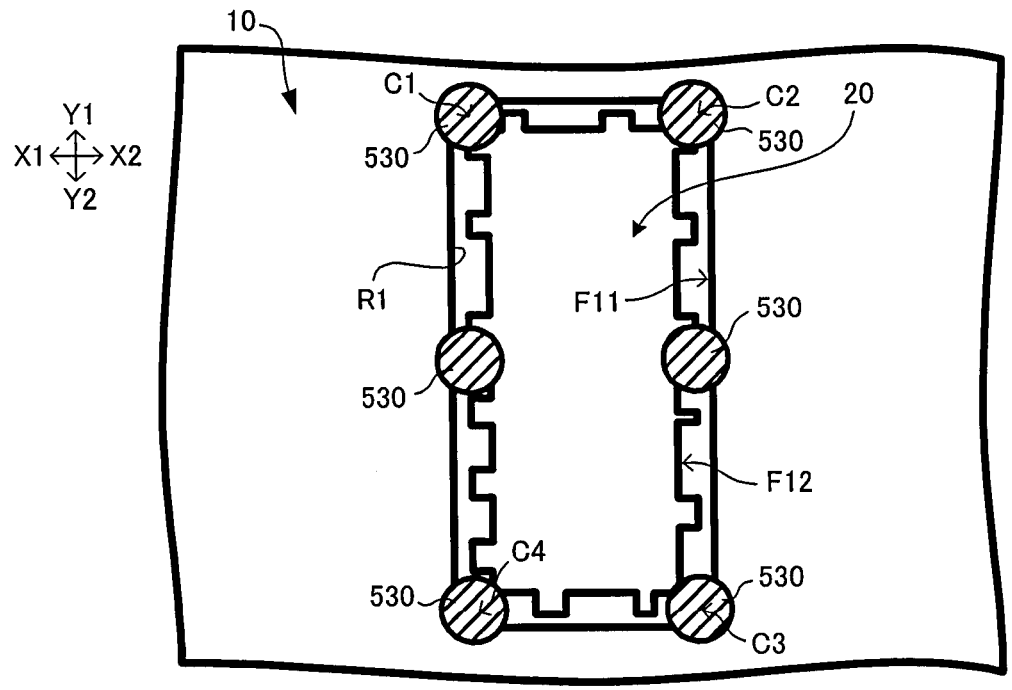
FIG. 23A is, in yet another embodiment of the present invention, a view showing an example in which a wall surface of the accommodation section in a first rigid wiring board is formed in a straight line and a side surface of a second rigid wiring board is formed in a zigzag pattern.
Figure 23B:
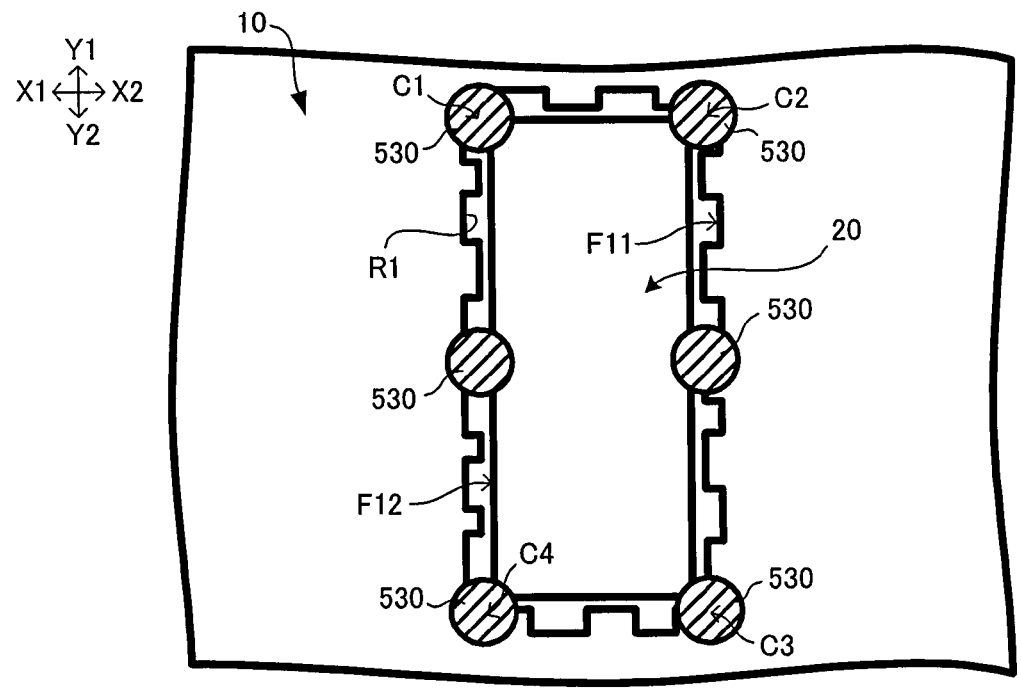
FIG. 23B is, in yet another embodiment of the present invention, a view showing an example in which a wall surface of the accommodation section in a first rigid wiring board is formed in a zigzag pattern and a side surface of a second rigid wiring board is formed in a straight line.

The wall surface of accommodation section (R1) facing side surface (F12) of wiring board 20 is preferred to have a concavo-convex shape corresponding to the concavo-convex shape of side surface (F12) of wiring board 20. However, that is not the only option. For example, as shown in FIG. 23A, only side surface (F12) of wiring board 20 may be formed in a zigzag pattern, while the wall surface of accommodation section (R1) is in a straight line. Alternatively, as shown in FIG. 23B, for example, only the wall surface of accommodation section (R1) is formed in a zigzag pattern, while side surface (F12) of wiring board 20 is in a straight line.

If at least either side surface (F11) of wiring board 10 (wall surface of accommodation section (R1)) or side surface (F12) of wiring board 20 (second rigid wiring board) is formed in a zigzag pattern, resistance is enhanced in the wiring board. That is because when side surface (F12) of wiring board 20 and the wall surface of accommodation section (R1) are formed in a zigzag pattern, contact areas increase between wiring board 10 and wiring board 20, and thus cracking is thought to be suppressed. In addition, peeled portions as a result of cracking may cause defects by protruding through surfaces of wiring boards. Therefore, by suppressing cracking, production yields improve. Also, when the wall surface of accommodation section (R1) and side surface (F12) of wiring board 20 are both formed in a zigzag pattern, the effects are thought to be multiplied.

To suppress cracking or the like, it is preferred that entire side surface (F12) of wiring board 20 and entire side surface (F11) of wiring board 10 (wall surface of accommodation section (R1)) have a concavo-convex shape. However, that is not the only option. If partial regions are formed in a straight line, that is sufficient to achieve certain effects. It is preferred that 50% or greater of the entire periphery of wiring board 20 be formed in a zigzag pattern.

The planar shape (X-Y plane) of via holes, through holes or lands in each layer may be determined freely.

Figure 24A:
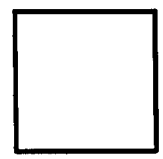
FIG. 24A is, in yet another embodiment of the present invention, a view showing a first example of the planar shape of a via hole, through hole or land.

For example, other than a perfect circle, their planar shape may be a square as shown in FIG. 24A, for example. Alternatively, it may be a regular polygon such as a regular hexagon, regular octagon or the like. The shape of angles in polygons may be determined freely. For example, they may be right, acute, obtuse or even roundish. However, to prevent a concentration of thermal stress, roundish angles are preferred.

Figure 24B:
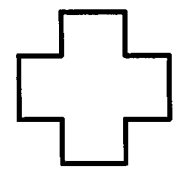
FIG. 24B is, in yet another embodiment of the present invention, a view showing a second example of the planar shape of a via hole, through hole or land.
Figure 24C:
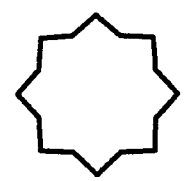
FIG. 24C is, in yet another embodiment of the present invention, a view showing a third example of the planar shape of a via hole, through hole or land.

Also, the above planar shape may be an ellipse, a rectangle, a triangle or the like. Moreover, as shown in FIGS. 24B and 24C, shapes such as a cross or a regular polygonal star formed by drawing straight lines to radiate out from the center (shapes in which multiple spokes are positioned in a radial pattern) may be effective as the above planar shape.

Cross-sectional shapes (X-Z plane, Y-Z plane) of via holes and through holes in each layer may also be determined freely.

Figure 25A:
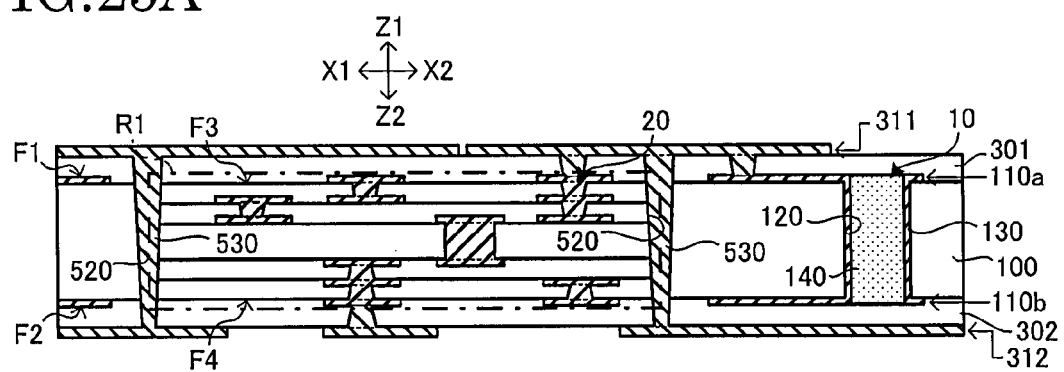
FIG. 25A is, in yet another embodiment of the present invention, a view showing a first example of the cross-sectional shape of a joint conductor.
Figure 25B:
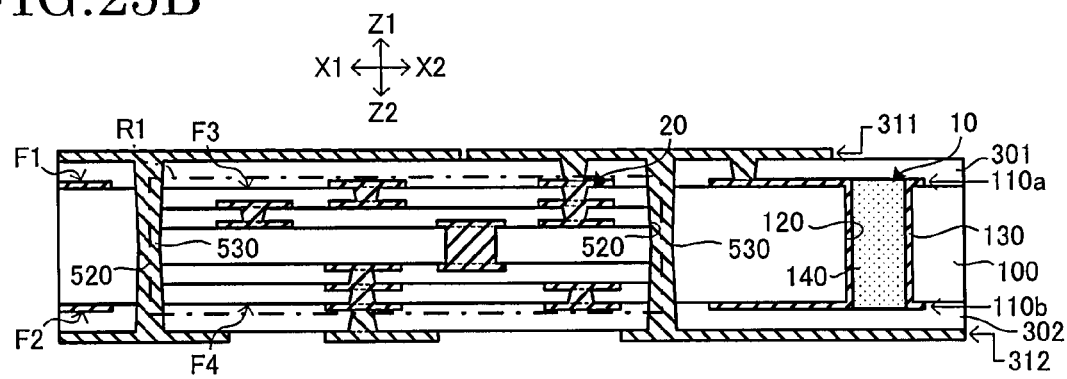
FIG. 25B is, in yet another embodiment of the present invention, a view showing a second example of the cross-sectional shape of a joint conductor.

For example, as shown in FIG. 25A, through-hole conductor 530 (joint conductor) and its hole may be shaped as a tapered column (truncated cone). Also, through-hole conductor 530 (joint conductor) and its hole may be shaped like an hourglass. Such an hourglass shape tapers with a diameter decreasing from both of its ends toward the inner layer.

Figure 26A:
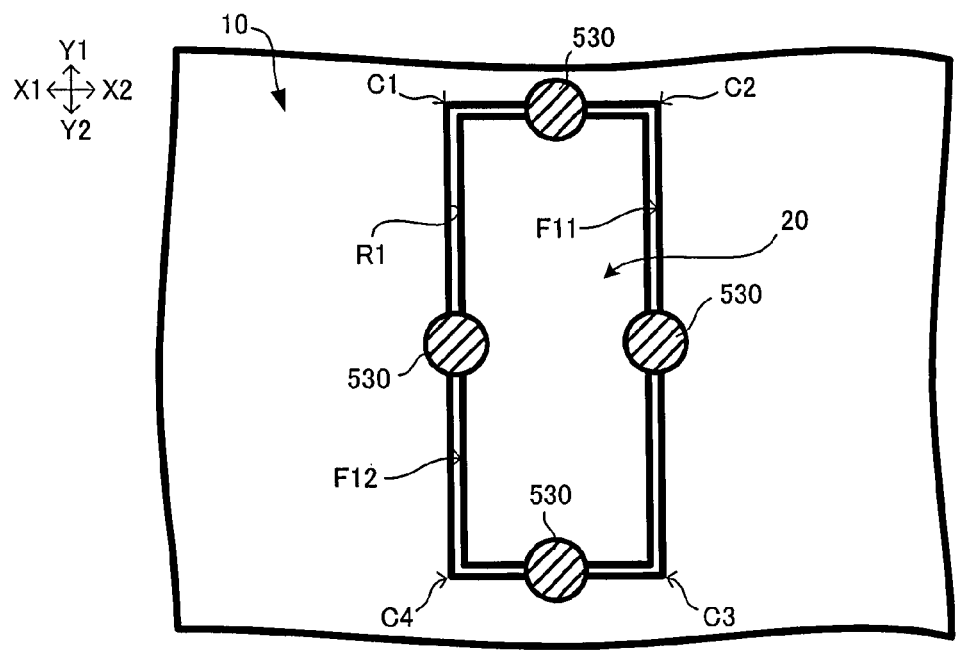
FIG. 26A is, in yet another embodiment of the present invention, a view showing an example in which a joint conductor is formed only on a side of a second rigid wiring board.

In the above embodiment, through-hole conductor 530 (joint conductor) is positioned in a corner of wiring board 20 (second rigid wiring board). However, that is not the only option, and through-hole conductor 530 may be positioned freely as long as it penetrates through both wiring board 10 (first rigid wiring board) and wiring board 20 (second rigid wiring board). For example, as shown in FIG. 26A, through-hole conductor 530 may be positioned only on a side of wiring board 20.

Figure 26B:
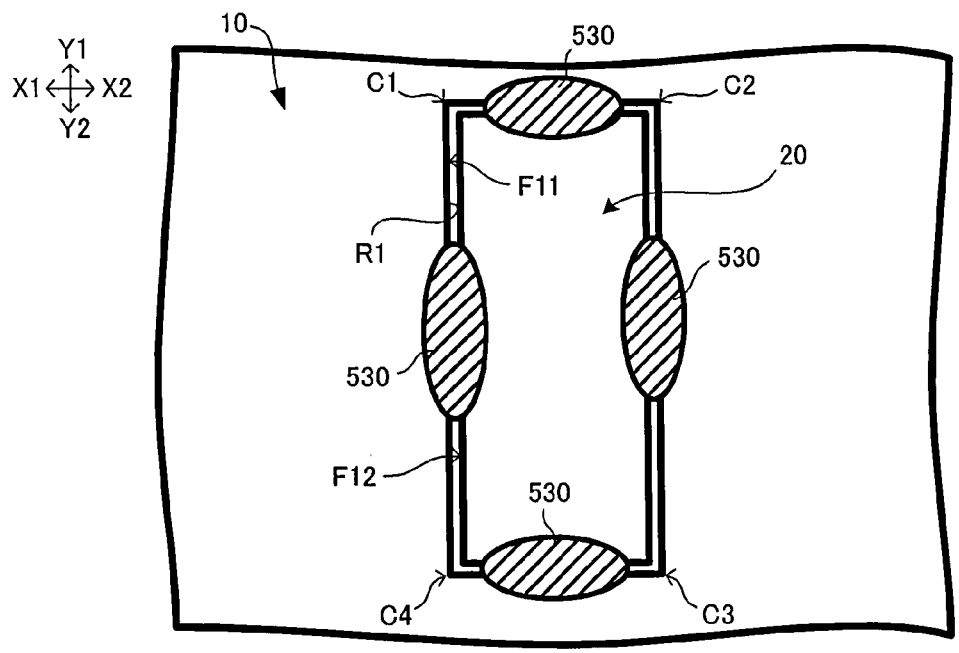
FIG. 26B is, in yet another embodiment of the present invention, a view showing an example in which a joint conductor is formed to extend along a boundary line between a first rigid wiring board and a second rigid wiring board.

As shown in FIG. 26B, for example, through-hole conductor 530 (joint conductor) may be extended along boundary line (L1) between wiring board 10 (first rigid wiring board) and wiring board 20 (second rigid wiring board). In the example in FIG. 26B, the planar shape (X-Y plane) of through-hole conductor 530 is an ellipse.

Figure 27A:
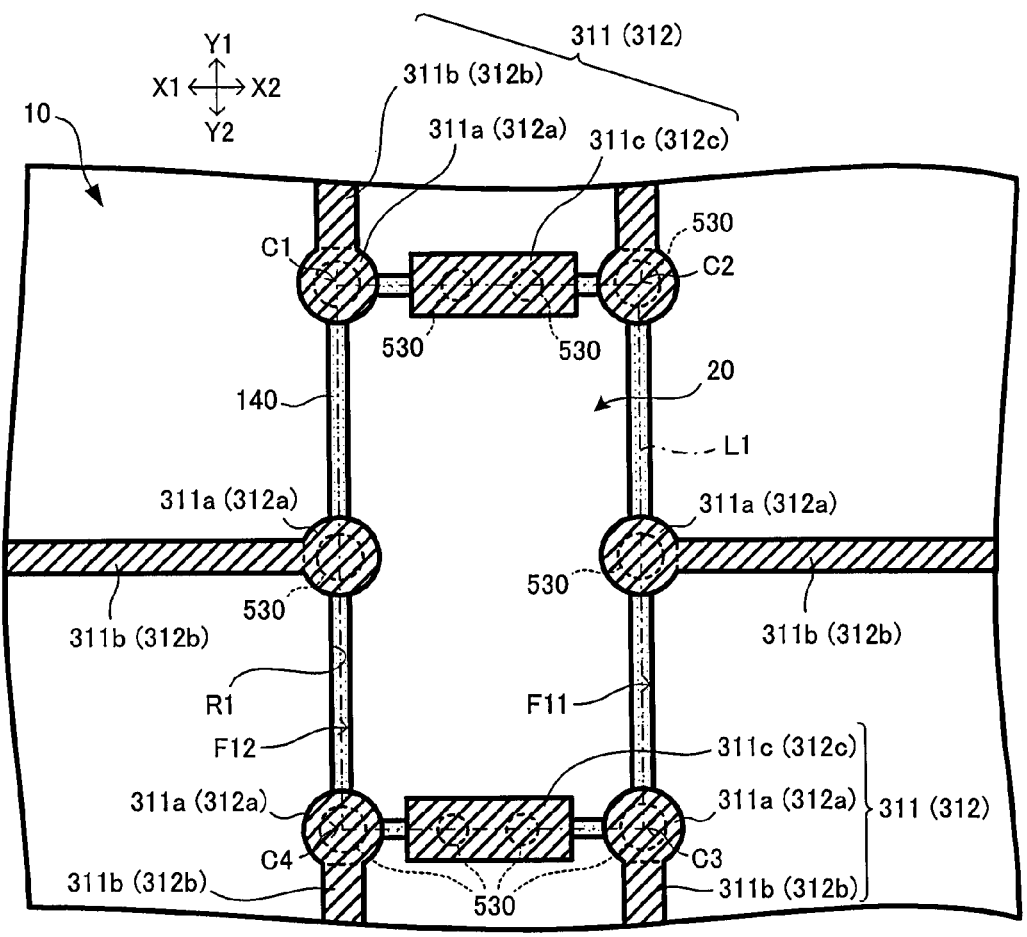
FIG. 27A is, in yet another embodiment of the present invention, a view showing an example in which a joint conductor is connected to a planar conductive film formed on a boundary portion between a first rigid wiring board and a second rigid wiring board.
Figure 27B:
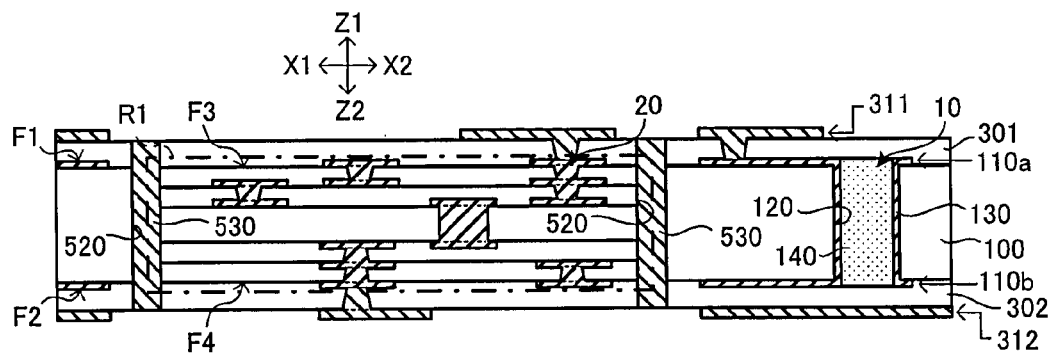
FIG. 27B is, in yet another embodiment of the present invention, a view showing an example in which a joint conductor is not connected to a conductive layer.

As shown in FIG. 27A, through-hole conductor 530 (joint conductor) may be connected to planar conductive films (311c, 312c) formed on a boundary portion (boundary line (L1)) between wiring board 10 and wiring board 20. In the example in FIG. 27A, conductive films (311c, 312c) are extended along boundary line (L1), and multiple through-hole conductors 530 (joint conductors) arrayed along boundary line (L1) are connected to conductive films (311c, 312c). In the above embodiment, conductive layers (such as planar conductive patterns) are connected to both ends of through-hole conductor 530 (joint conductor). However, that is not the only option. For example, as shown in FIG. 27B, it is an option for through-hole conductor 530 not to be connected to conductive layers (311, 312). Alternatively, it is also an option for only one end of through-hole conductor 530 to be connected to a conductive layer. However, to strengthen the joint by through-hole conductor 530, both ends of through-hole conductor 530 are preferred to be connected to conductive layers (311, 312).

Figure 28:
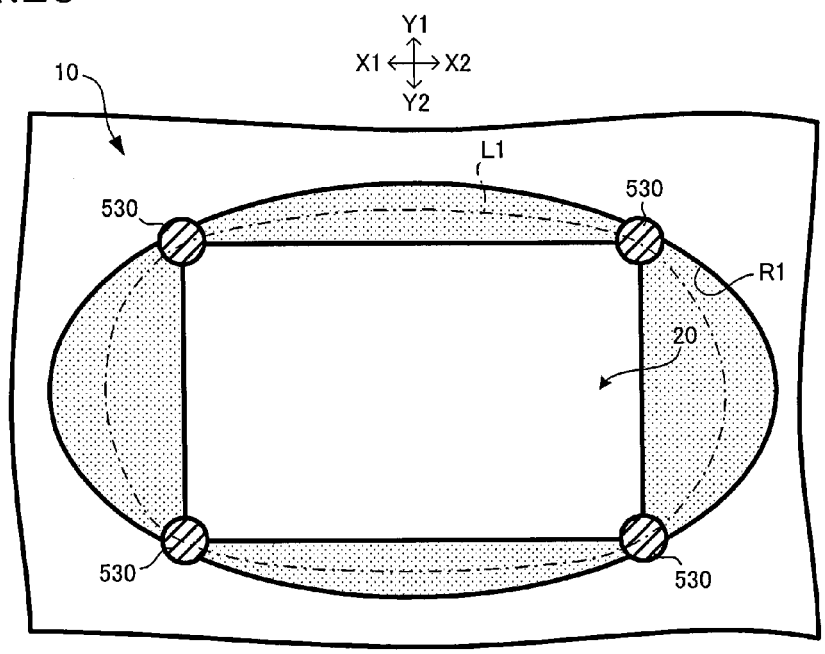
FIG. 28 is, in yet another embodiment of the present invention, a view showing an example of planar shapes of a second rigid wiring board and an accommodation section.

The planar shapes (X-Y plane) of wiring board 10 (first rigid wiring board), wiring board 20 (second rigid wiring board) and accommodation section (R1) are not limited specifically. The planar shape of wiring board 20 is not always required to correspond to the planar shape of accommodation section (R1). For example, as shown in FIG. 28, it is an option for the planar shape of wiring board 20 not to be similar to the planar shape of accommodation section (R1). In the example in FIG. 28, the planar shape of wiring board 20 is a rectangle, and the planar shape of accommodation section (R1) is an ellipse.

Figure 29:
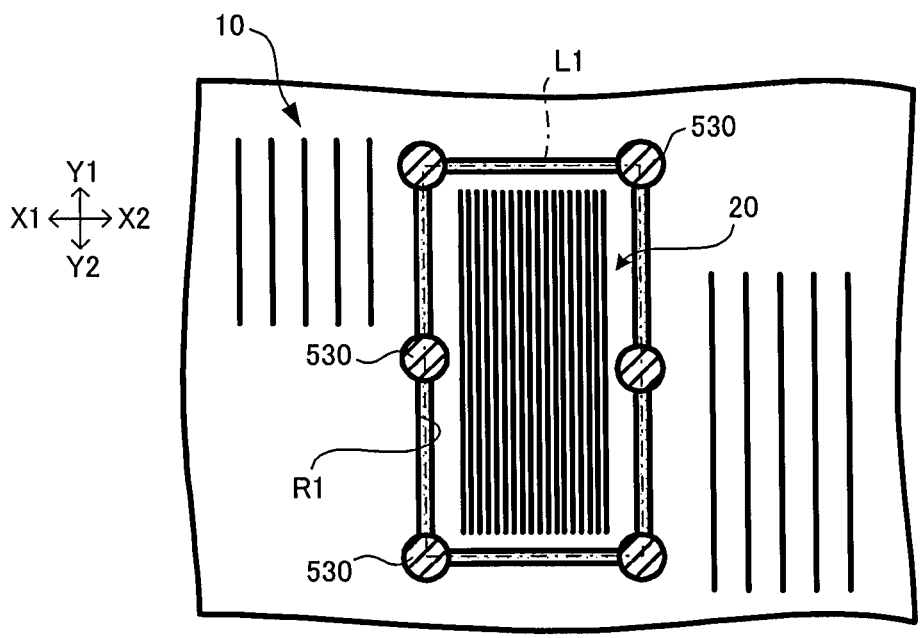
FIG. 29 is, in yet another embodiment of the present invention, a view showing an example in which the conductive-pattern density in a second rigid wiring board is higher than the conductive-pattern density in a first rigid wiring board.

As shown in FIG. 29, the density of conductive patterns in wiring board 20 (second rigid wiring board) may be higher than the density of conductive patterns in wiring board 10 (first rigid wiring board). In such a case as well, since the density of existing conductors in wiring board 20 is higher than the density of existing conductors in wiring board 10, the conductor density of wiring board 1000 may be partially set higher (set as high-density wiring). The density of conductive patterns increases as L (line)/S (space) becomes narrower.

Figure 30:
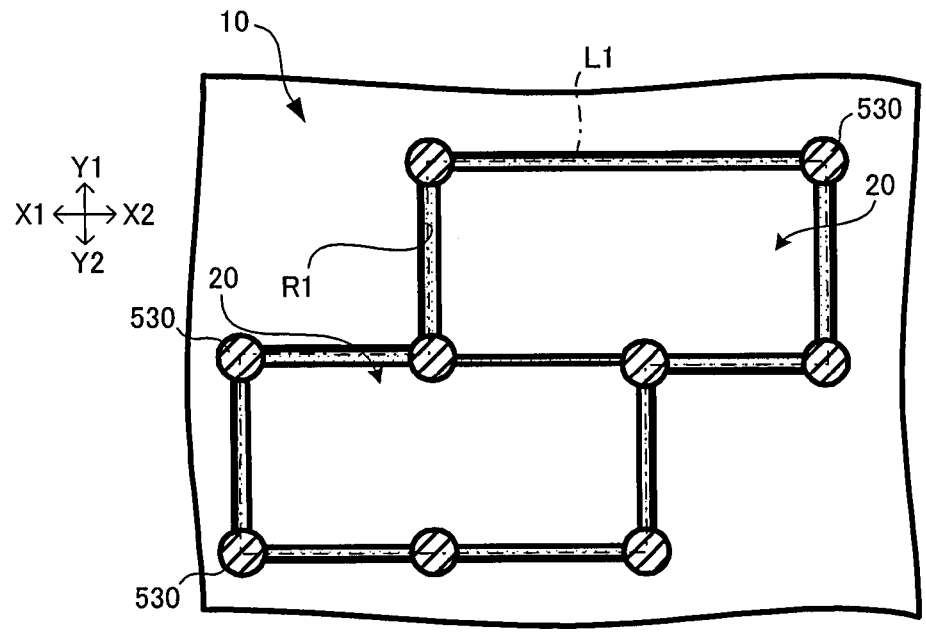
FIG. 30 is, in yet another embodiment of the present invention, a view showing an example in which multiple second rigid wiring boards are accommodated in one accommodation section formed in a first rigid wiring board.

As shown in FIG. 30, multiple (such as two) wiring boards 20 (second rigid wiring boards) may be accommodated in one accommodation section (R1) formed in wiring board 10 (first rigid wiring board).

Figure 31:
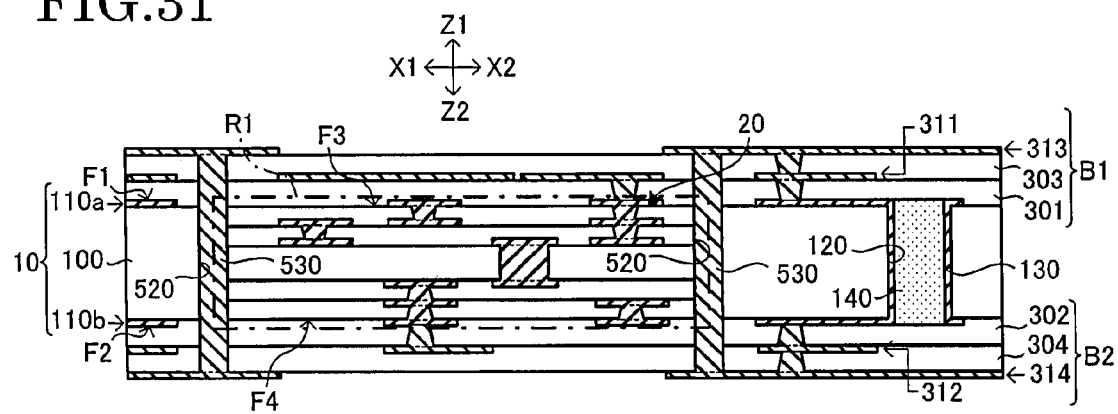
FIG. 31 is, in yet another embodiment of the present invention, a view showing a first example of a wiring board having laminated sections formed by alternately laminating multiple insulation layers and multiple conductive layers on a first rigid wiring board and on a second rigid wiring board.
Figure 32:
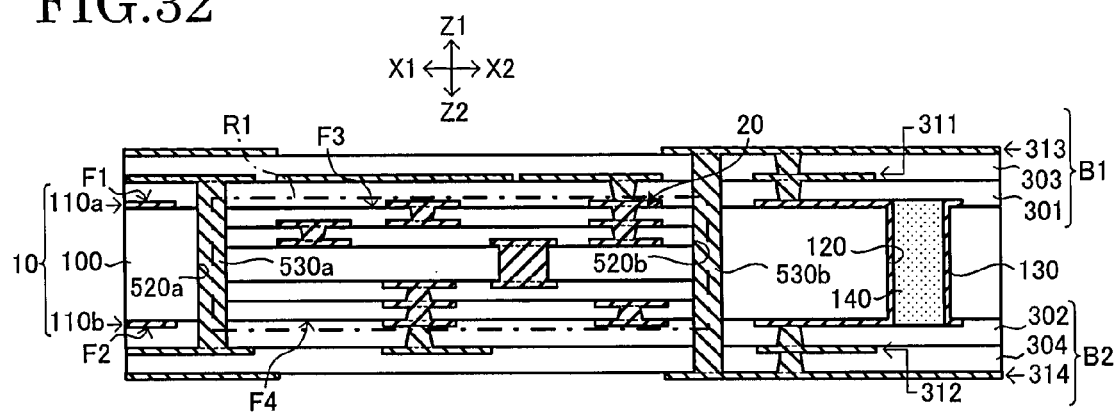
FIG. 32 is, in yet another embodiment of the present invention, a view showing a second example of a wiring board having laminated sections formed by alternately laminating multiple insulation layers and multiple conductive layers on a first rigid wiring board and on a second rigid wiring board.

As shown in FIG. 31, on wiring board 10 (first rigid wiring board) and wiring board 20 (second rigid wiring board), a wiring board may have laminated section (B1) where multiple insulation layers (301, 303) and multiple conductive layers (311, 313) are alternately laminated as well as laminated section (B2) where multiple insulation layers (302, 304) and multiple conductive layers (312, 314) are alternately laminated. In the example shown in FIG. 31, through hole 520 for through-hole conductor 530 (joint conductor) penetrates through laminated sections (B1, B2) as well as wiring boards (10, 20). However, it is also an option for through hole 520 not to penetrate through laminated sections (B1, B2). Alternatively, as shown in FIG. 32, for example, a wiring board may have through-hole conductor (530a) (and its through hole 520a) which does not penetrate through laminated sections (B1, B2) as well as through-hole conductor (530b) (and its through hole 520b) which penetrates through laminated sections (B1, B2).

Figure 33:
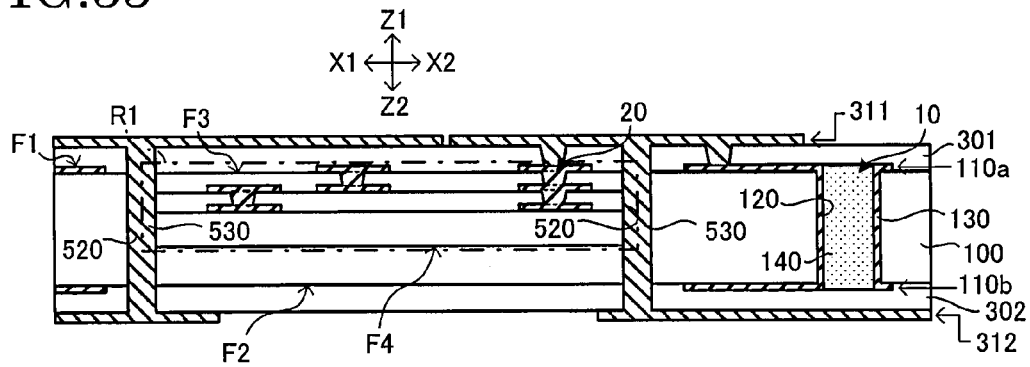
FIG. 33 is, in yet another embodiment of the present invention, a view showing an example in which the accommodation section formed in a first rigid wiring board is a hole that does not penetrate through the first rigid wiring board.

Accommodation section (R1) is not limited to a hole that penetrates through wiring board 10 (first rigid wiring board). For example, as shown in FIG. 33, it may be a hole that does not penetrate through wiring board 10. However, to manufacture wiring boards more easily, or to accommodate even further multilayered wiring board 20 in accommodation section (R1), accommodation section (R1) is preferred to be a hole that penetrates through wiring board 10. Also, accommodation section (R1) may be an opening portion such as a groove, notch, cut or the like.

Figure 34:
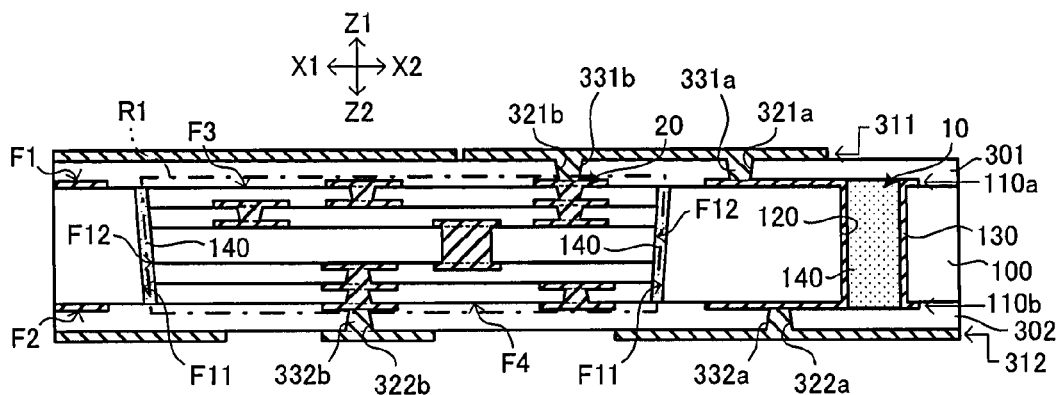
FIG. 34 is, in yet another embodiment of the present invention, a view showing an example in which the wall surface of an accommodation section tapers.
Figure 35A:
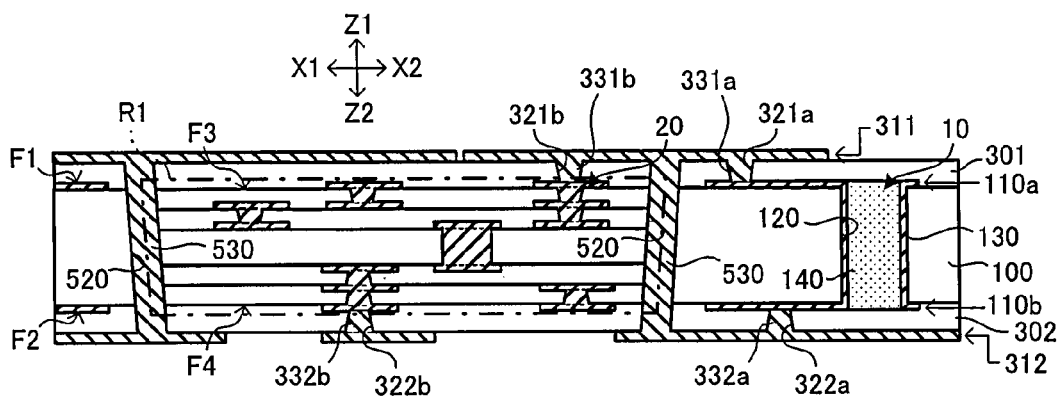
FIG. 35A is, in the wiring board shown in FIG. 34, a view showing an example in which a joint conductor and its hole are formed to be parallel to the wall surface of the accommodation section.
Figure 35B:
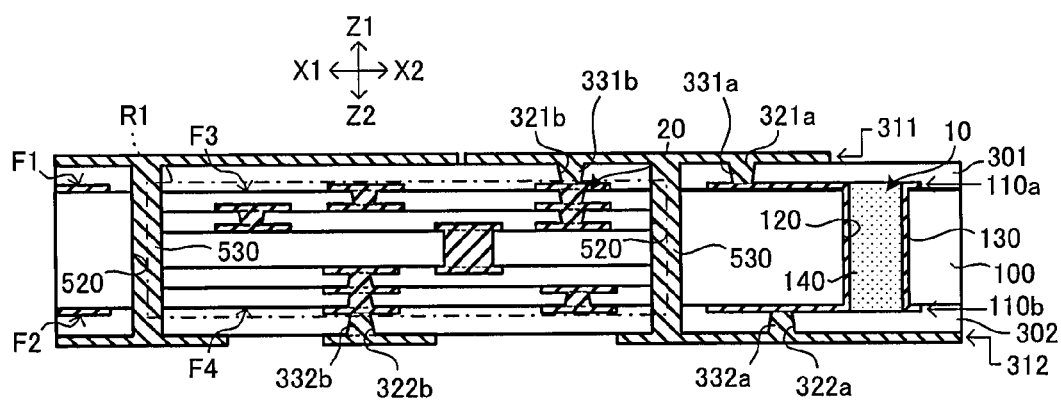
FIG. 35B is, in the wiring board shown in FIG. 34, a view showing an example in which a joint conductor and its hole are formed not to be parallel to the wall surface of the accommodation section.

The wall surface of accommodation section (R1) is not limited to being substantially perpendicular to main surfaces (FIG. 1), and it may be tapered as shown in FIG. 34, for example. In the example in FIG. 34, side surface (F12) of wiring board 20 also tapers corresponding to the wall surface of accommodation section (R1) (side surface (F11) of wiring board 10). In such a case, through-hole conductor 530 (joint conductor) and its hole may be formed to be parallel to the wall surface of accommodation section (R1) as shown in FIG. 35A, for example, or they may be formed not to be parallel to the wall surface of accommodation section (R1) (to be substantially perpendicular to main surfaces, for example) as shown in FIG. 35B.

Figure 36:
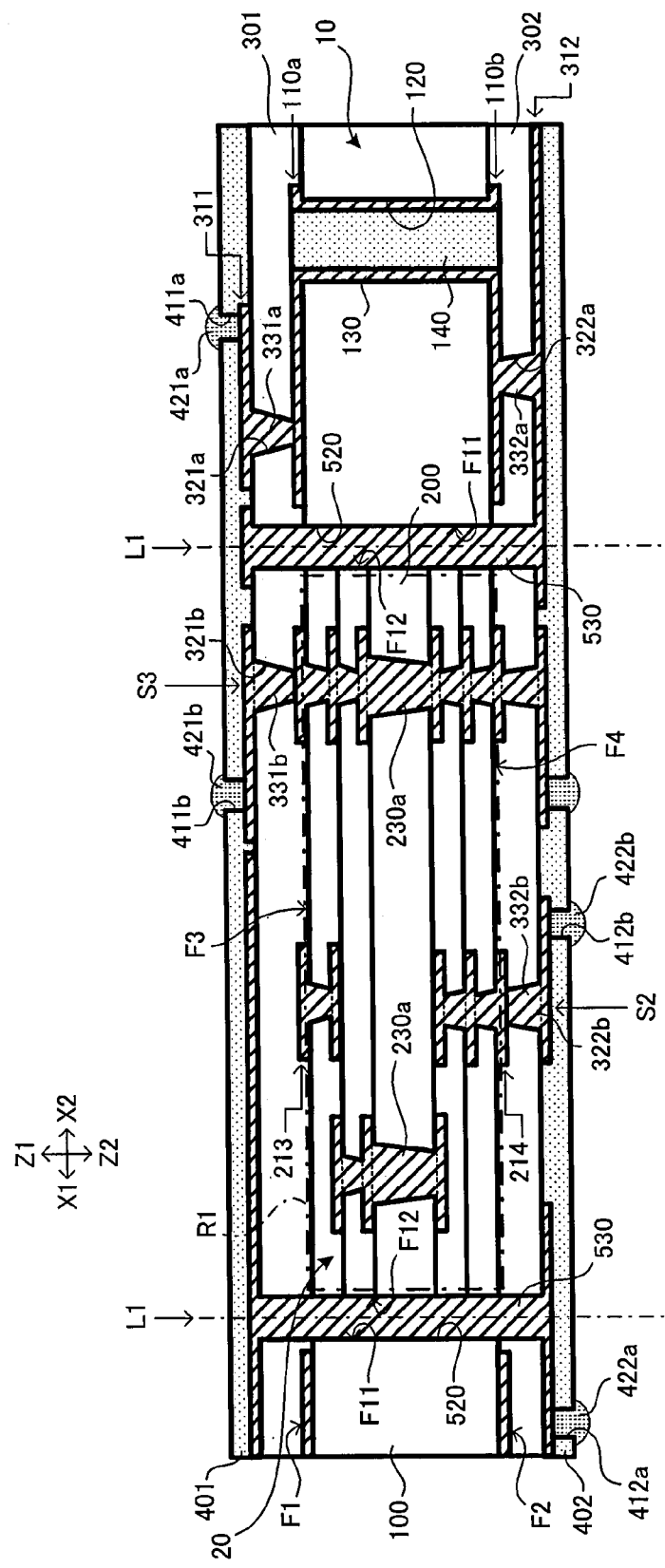
FIG. 36 is, in the embodiments of the present invention, a view showing an example in which a via conductor instead of a through-hole conductor is formed in the core substrate of a second rigid wiring board built into a wiring board.

As shown in FIG. 36, instead of through-hole conductor 230 (FIG. 5), via conductor (230a) (filled conductor) may be formed in the core substrate (substrate 200) of wiring board 20.

Also, as shown in FIG. 36, there may be stacked-conductor structure (S3) (full stack structure) formed by stacking filled conductors (such as via conductors) in all the layers of a wiring board. In the example in FIG. 36, outermost conductive layers on upper and lower surfaces of a wiring board (conductive layers (311, 312) are electrically connected to each other by stacked-conductor structure (S3).

Regarding other factors, structures of wiring boards (10, 20) and insulation layers formed as their upper layers, as well as type, performance, measurements, quality, shapes, number of layers, positioning and so forth of the elements of such structures, may be modified freely within a scope that does not deviate from the gist of the present invention.

Wiring boards (10, 20) may each be a wiring board with a built-in electronic component.

To improve strength or enhance heat dissipation, a metal sheet may be built into the core substrate of wiring board 10 or 20.

The method for connecting wiring board 10 and wiring board 20 is not limited specifically. For example, wire bonding, flip-chip connection or the like may be employed.

The number of buildup layers may be different on the upper and lower surfaces of a wiring board. However, to mitigate stress, it is considered preferable to form the same number of buildup layers on the upper and lower surfaces of a wiring board so that symmetry on the upper and lower surfaces is enhanced.

Wiring boards (10, 20) may each be a single-sided wiring board having conductor (conductive layer) only on either the upper or the lower surface of the core substrate.

The structure of each conductive layer is not limited to being a triple-layered structure of metal foil, electroless plated film and electrolytic plated film. For example, it may be a double-layered structure of metal foil and electroless plated film or electrolytic plated film. Also, the structure of each filled conductor is not limited to being a double-layered structure of electroless plated film and electrolytic plated film. For example, it may be a single-layered structure only of electroless plated film or electrolytic plated film. If electroless plated film is omitted, a decrease in the adhesiveness between an insulation layer and a conductive layer may become a concern. Thus, surface treatment is preferred to be conducted on the insulation layer to enhance adhesiveness if required.

Each via conductor is not limited to being a filled conductor, and may be a conformal conductor.

The contents and the order of the procedure in the above embodiment may be modified freely within a scope that does not deviate from the gist of the present invention. Also, some step may be omitted depending on usage requirements or the like.

For example, the method for forming each conductive layer may be determined freely. Conductive layers may be formed by any one of the following methods or a combination of two or more of them: panel plating, pattern plating, full-additive, semi-additive (SAP), subtractive, transfer and tenting methods.

For example, conductive layers are formed by a subtractive method (a method for patterning through etching) in the above embodiment. However, a semi-additive (SAP) method may be used instead of a subtractive method. In a semi-additive method, after the entire surface of an insulative substrate is made conductive using electroless plated film (panel plating), resist is formed and electrolytic plating is formed where the resist is not present. Then, after the resist is removed, electroless plated film is patterned by etching.

Also, forming each insulation layer (interlayer insulation layer) is not limited to any specific method. For example, liquid or film-type thermosetting resins or their composite, or RCF (resin-coated copper foil) or the like may also be used instead of prepreg.

For example, wet or dry etching process may be employed instead of using a laser. When an etching process is employed, it is preferred to protect in advance with resist or the like portions that are not required to be removed.

A wiring board according to an embodiment of the present invention has a first rigid wiring board having an accommodation section, a second rigid wiring board accommodated in the accommodation section, and an insulation layer formed on the first rigid wiring board and on the second rigid wiring board. In such a wiring board, a joint conductor is formed in a hole that penetrates through both the first rigid wiring board and the second rigid wiring board, and connects a side surface of the first rigid wiring board and a side surface of the second rigid wiring board.

A method for manufacturing a wiring board according to another embodiment of the present invention includes the following: preparing a first rigid wiring board having an accommodation section; accommodating a second rigid wiring board in the accommodation section; forming an insulation layer on the first rigid wiring board and on the second rigid wiring board; forming a hole that penetrates through both the first rigid wiring board and the second rigid wiring board; and forming a joint conductor in the hole to connect a side surface of the first rigid wiring board and a side surface of the second rigid wiring board.

Obviously, numerous modifications and variations of the present invention are possible in light of the above teachings. It is therefore to be understood that within the scope of the appended claims, the invention may be practiced otherwise than as specifically described herein.

What is claimed is:

1. A wiring board, comprising:
   a first rigid wiring board having an accommodation portion;
   a second rigid wiring board accommodated in the accommodation portion;
   an insulation layer formed over the first rigid wiring board and the second rigid wiring board; and
   a joint conductor extending in a direction from a first surface of the first rigid wiring board to a second surface of the first rigid wiring board on an opposite side of the first surface of the first rigid wiring board such that the joint conductor is penetrating through a boundary between the first rigid wiring board and the second rigid wiring board and joining the first rigid wiring board and the second rigid wiring board.

2. The wiring board according to claim 1, wherein the joint conductor has one end portion connected to a land structure and the other end portion connected to another land structure.

3. The wiring board according to claim 1, wherein the joint conductor is formed in a plurality, and the plurality of joint conductors is positioned along a boundary line between the first rigid wiring board and the second rigid wiring board.

4. The wiring board according to claim 1, wherein the joint conductor is positioned in a corner of the second rigid wiring board.

5. The wiring board according to claim 1, wherein the joint conductor is positioned on a side of the second rigid wiring board.

6. The wiring board according to claim 1, wherein the joint conductor is extended along a boundary line between the first rigid wiring board and the second rigid wiring board.

7. The wiring board according to claim 1, wherein the joint conductor is penetrating through the insulation layer.

8. The wiring board according to claim 1, wherein the insulation layer is formed in a laminated structure formed over the first rigid wiring board and the second rigid wiring board, the laminated structure has a plurality of conductive layers and a plurality of insulation layers including the insulation layer, and the joint conductor is penetrating through the laminated structure.

9. The wiring board according to claim 1, wherein the joint conductor has one end portion connected to an outermost conductive layer and the other end portion connected to another outermost conductive layer.

10. The wiring board according to claim 1, wherein the joint conductor is formed in a hole extending in the direction from the first surface of the first rigid wiring board to the second surface of the first rigid wiring board and comprises a plating material filling the hole.

11. The wiring board according to claim 1, wherein the first rigid wiring board has a conductor electrically connected to a conductor in the second rigid wiring board.

12. The wiring board according to claim 1, wherein the first rigid wiring board and the second rigid wiring board form a gap in the boundary between the first rigid wiring board and the second rigid wiring board, and the gap in the boundary between the first rigid wiring board and the second rigid wiring board is filled with a resin.

13. The wiring board according to claim 1, wherein the first rigid wiring board has a conductor electrically connected to a conductor in the second rigid wiring board by a plurality of via conductors formed in the insulation layer.

14. The wiring board according to claim 1, wherein the first rigid wiring board has a plurality of conductive layers, the second rigid wiring board has a plurality of conductive layers, and the plurality of conductive layers in the first rigid wiring board is less in number of layers than the plurality of conductive layers in the second rigid wiring board.

15. The wiring board according to claim 1, further comprising:
   an external connection terminal formed in a region directly over the first rigid wiring board; and
   an external connection terminal formed in a region directly over the second rigid wiring board.

16. The wiring board according to claim 1, wherein at least one of the first rigid wiring board and the second rigid wiring board has a zigzag patterned surface in at least one of a wall surface forming the accommodation portion of the first rigid wiring board and a side surface of the second rigid wiring board.

17. The wiring board according to claim 16, wherein the zigzag patterned surface is formed by cutting the wall surface forming the accommodation portion in the first rigid wiring board or the side surface in the second rigid wiring board.

18. The wiring board according to claim 1, wherein the first rigid wiring board has a zigzag patterned wall surface forming the accommodation portion, the second rigid wiring board has a zigzag patterned side surface facing the zigzag patterned wall surface of the first rigid wiring board such that the zigzag patterned wall surface of the first rigid wiring board forms a convex-concave shape corresponding to a concavo-convex shape of the zigzag patterned side surface of the second rigid wiring board.

19. The wiring board according to claim 1, further comprising a planar conductive film formed directly over the boundary between the first rigid wiring board and the second rigid wiring board.

20. The wiring board according to claim 19, wherein the joint conductor is connected to the planar conductive film.

21. The wiring board according to claim 20, wherein the joint conductor is formed in a plurality, the planar conductive film is extended along a boundary line between the first rigid wiring board and the second rigid wiring board, and the plurality of joint conductors is connected to the planar conductive film.

22. The wiring board according to claim 1, wherein the joint conductor is made of a same conductive material as a conductor in the first rigid wiring board and a conductor in the second rigid wiring board.

23. A method for manufacturing a wiring board, comprising:
preparing a first rigid wiring board having an accommodation portion;
accommodating a second rigid wiring board in the accommodation portion of the first rigid wiring board;
forming an insulation layer over the first rigid wiring board and the second rigid wiring board;
forming a hole extending in a direction from a first surface of the first rigid wiring board to a second surface of the first rigid wiring board on an opposite side of the first surface of the first rigid wiring board such that the hole is penetrating through a boundary between the first rigid wiring board and the second rigid wiring board; and
forming a joint conductor in the hole such that the joint conductor joins the first rigid wiring board and the second rigid wiring board.

* * * * *